(12) United States Patent
Nguyen et al.

(10) Patent No.: US 10,796,876 B2
(45) Date of Patent: Oct. 6, 2020

(54) LOW WORK FUNCTION ELECTRON BEAM FILAMENT ASSEMBLY

(71) Applicant: Colorado State University Research Foundation, Fort Collins, CO (US)

(72) Inventors: Bao Gia Nguyen, Fort Collins, CO (US); John D. Williams, Fort Collins, CO (US); Desiree D. Williams, Fort Collins, CO (US); Casey C. Farnell, Fort Collins, CO (US); Ryan Kenneth Ham, Fort Collins, CO (US); Kathryn Elizabeth Greiner, Fort Collins, CO (US)

(73) Assignee: COLORADO STATE UNIVERSITY RESEARCH FOUNDATION, Fort Collins, CO (US)

( * ) Notice: Subject to any disclaimer, the term of this patent is extended or adjusted under 35 U.S.C. 154(b) by 0 days.

(21) Appl. No.: 15/983,967

(22) Filed: May 18, 2018

(65) Prior Publication Data

US 2018/0269024 A1   Sep. 20, 2018

Related U.S. Application Data

(63) Continuation-in-part of application No. 15/466,768, filed on Mar. 22, 2017, now Pat. No. 10,002,738.

(Continued)

(51) Int. Cl.
*H01J 29/48* (2006.01)
*H01J 9/04* (2006.01)

(Continued)

(52) U.S. Cl.
CPC .............. *H01J 29/48* (2013.01); *B33Y 30/00* (2014.12); *B33Y 40/00* (2014.12); *H01J 1/28* (2013.01);

(Continued)

(58) Field of Classification Search
CPC ............ H01J 29/48; H01J 3/027; H01J 9/042; H05H 1/48
See application file for complete search history.

(56) References Cited

U.S. PATENT DOCUMENTS

| 3,558,966 A | 1/1971 | Hill et al. |
|---|---|---|
| 3,798,492 A | 3/1974 | Menelly |

(Continued)

*Primary Examiner* — Joseph L Williams
*Assistant Examiner* — Jacob R Stern
(74) *Attorney, Agent, or Firm* — Maschoff Brennan; Paul G. Johnson

(57) ABSTRACT

A filament assembly can include: a button having a planar emitter region with one or more apertures extending from an emission surface of the planar emitter region to an internal surface opposite of the emission surface; an inlet electrical lead coupled to the button at a first side; an outlet electrical lead coupled to the button at a second side opposite of the first side; and a low work function object positioned adjacent to the internal surface of the planar emitter region and retained to the button. The planar emitter region can include a plurality of apertures. The low work function object can include a porous ceramic material having the barium, and may have a polished external surface. An electron gun can include the filament assembly. An additive manufacturing system can include the electron gun having the filament assembly.

20 Claims, 17 Drawing Sheets

Related U.S. Application Data

(60) Provisional application No. 62/509,103, filed on May 20, 2017, provisional application No. 62/311,744, filed on Mar. 22, 2016.

(51) Int. Cl.
| | |
|---|---|
| *H01J 37/02* | (2006.01) |
| *B33Y 40/00* | (2020.01) |
| *H05H 1/48* | (2006.01) |
| *H01J 1/28* | (2006.01) |
| *H01J 37/065* | (2006.01) |
| *B33Y 30/00* | (2015.01) |
| *H01J 29/04* | (2006.01) |
| *H01J 3/02* | (2006.01) |
| *B22F 3/105* | (2006.01) |
| *H01J 27/20* | (2006.01) |

(52) U.S. Cl.
CPC ............ *H01J 9/042* (2013.01); *H01J 9/047* (2013.01); *H01J 29/04* (2013.01); *H01J 37/026* (2013.01); *H01J 37/065* (2013.01); *H05H 1/48* (2013.01); *B22F 3/1055* (2013.01); *B22F 2003/1056* (2013.01); *H01J 3/027* (2013.01); *H01J 27/205* (2013.01); *H01J 2237/06308* (2013.01); *H01J 2237/3104* (2013.01)

(56) References Cited

U.S. PATENT DOCUMENTS

| | | | | |
|---|---|---|---|---|
| 3,906,281 | A | * | 9/1975 | Nakamura ............... H01J 29/94 313/481 |
| 4,101,800 | A | * | 7/1978 | Thomas ................... H01J 1/28 313/346 DC |
| 4,163,918 | A | * | 8/1979 | Shelton ................. H01J 1/3042 313/309 |
| 6,420,673 | B1 | | 7/2002 | Nemchinsky |
| 2004/0119025 | A1 | * | 6/2004 | Klepper ................... G21K 1/08 250/424 |
| 2005/0173380 | A1 | * | 8/2005 | Carbone ............... B22F 3/1055 219/121.31 |

\* cited by examiner

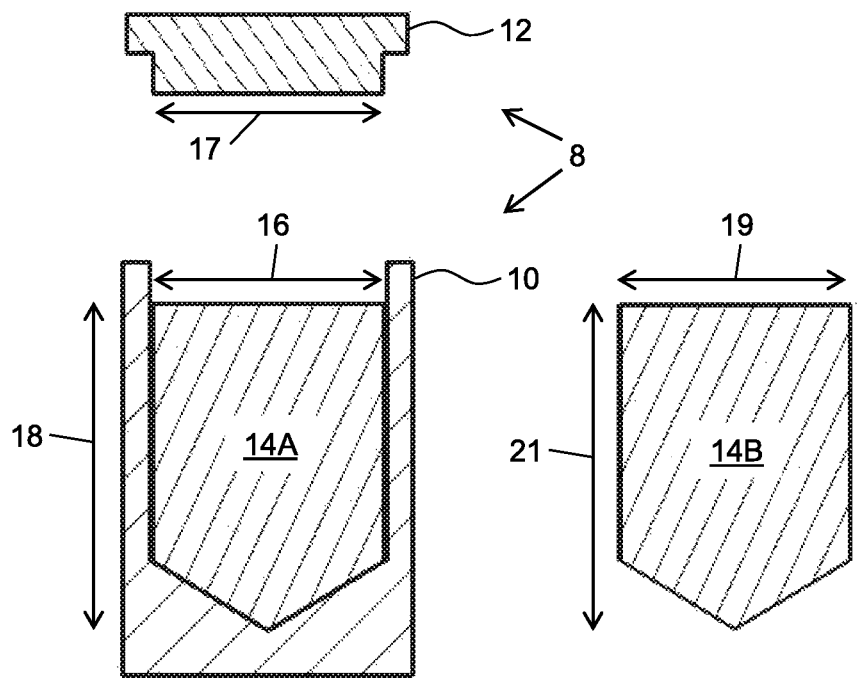
FIG. 2
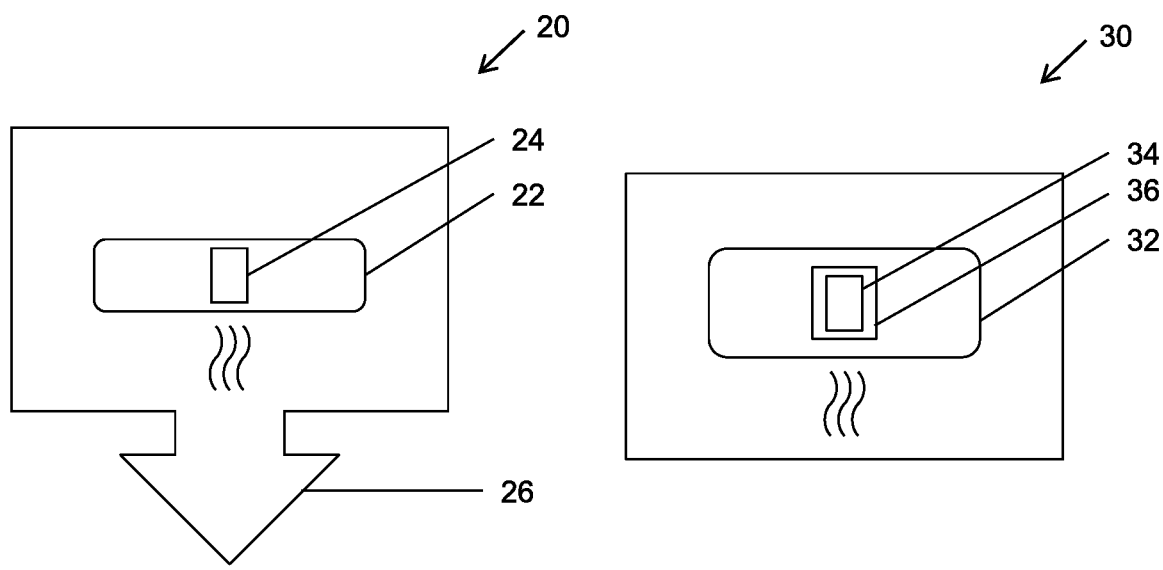
FIG. 3A
FIG. 3B

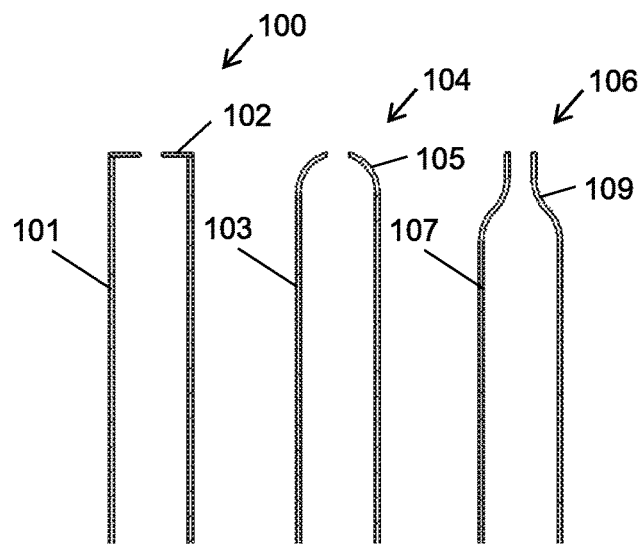
FIG. 8
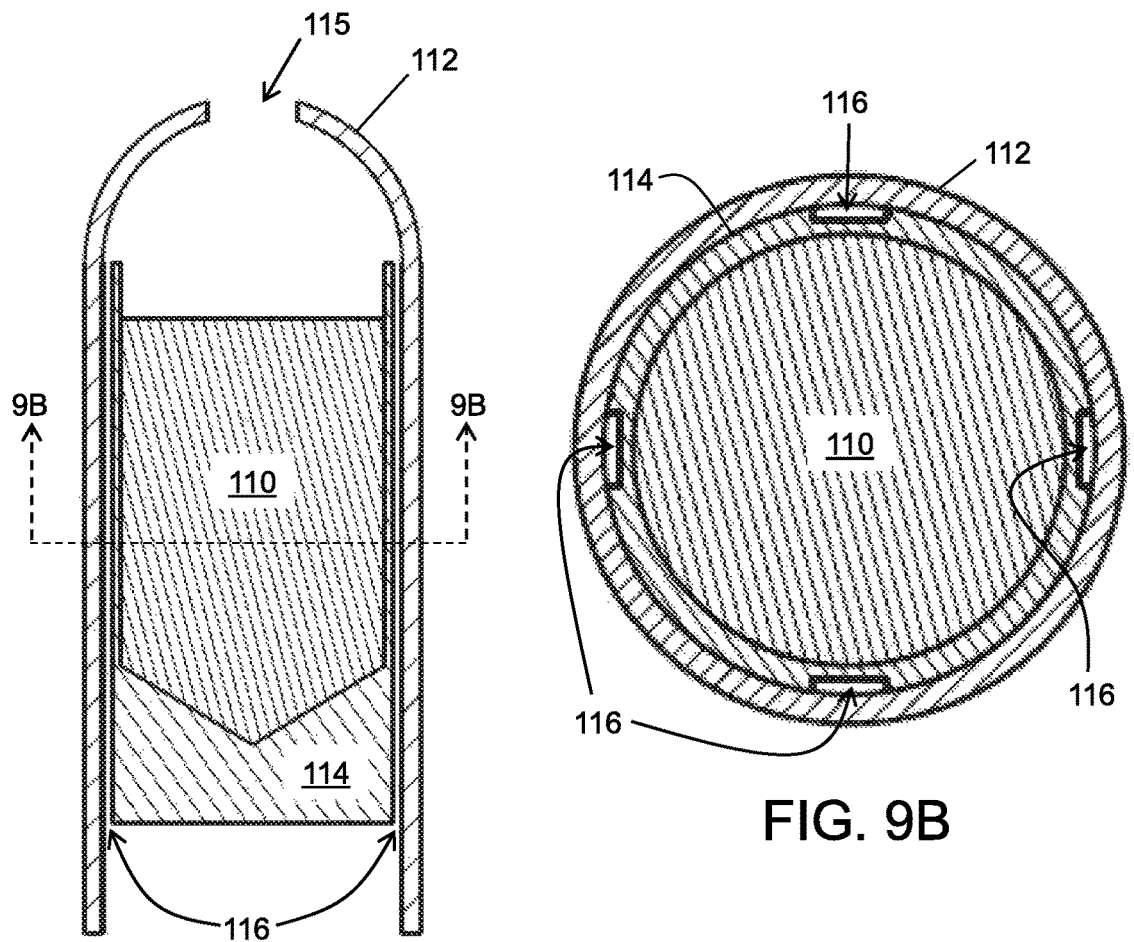
FIG. 9A
FIG. 9B

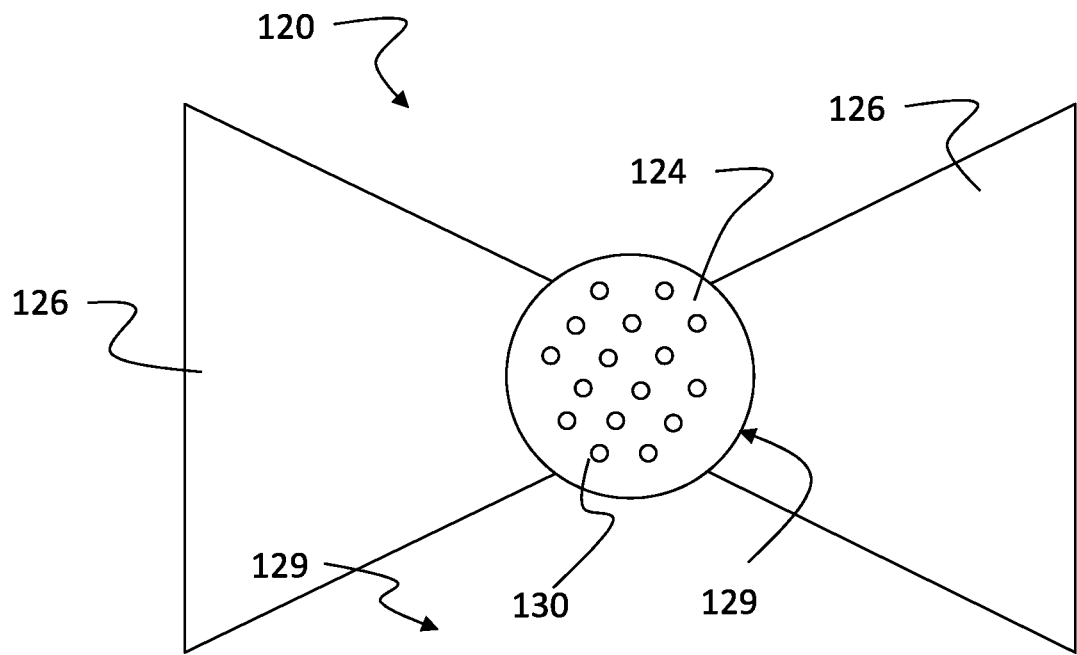
FIG. 11B
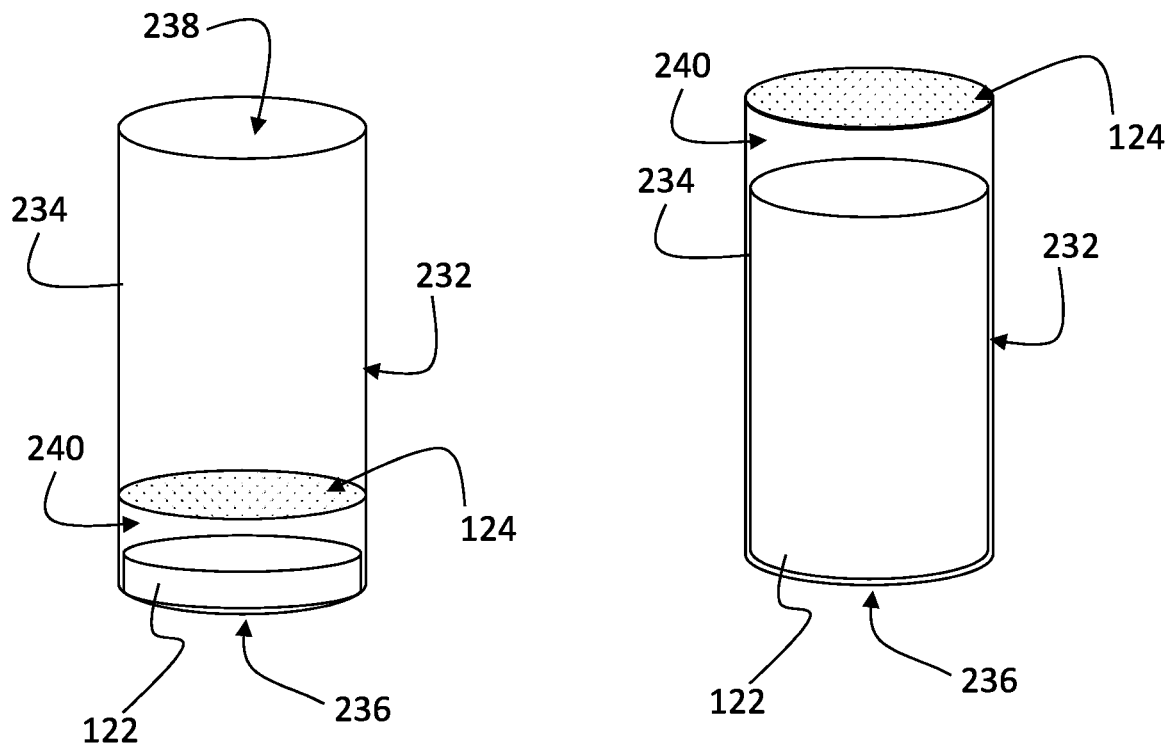
FIG. 11C
FIG. 11D

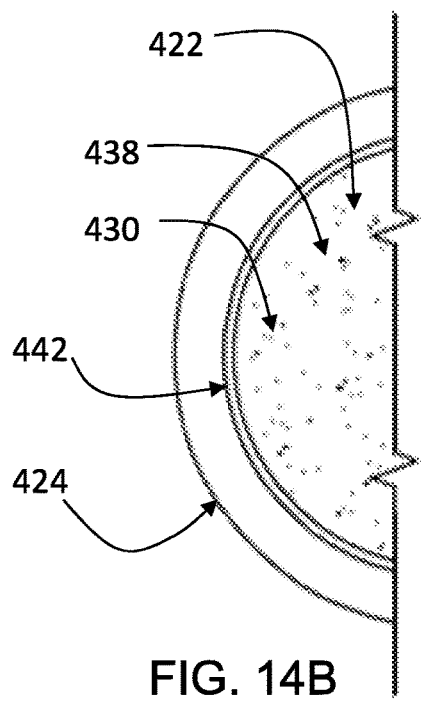
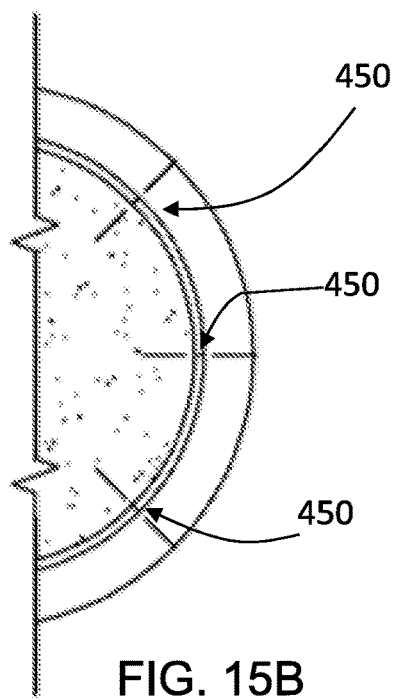
FIG. 14B  FIG. 15B
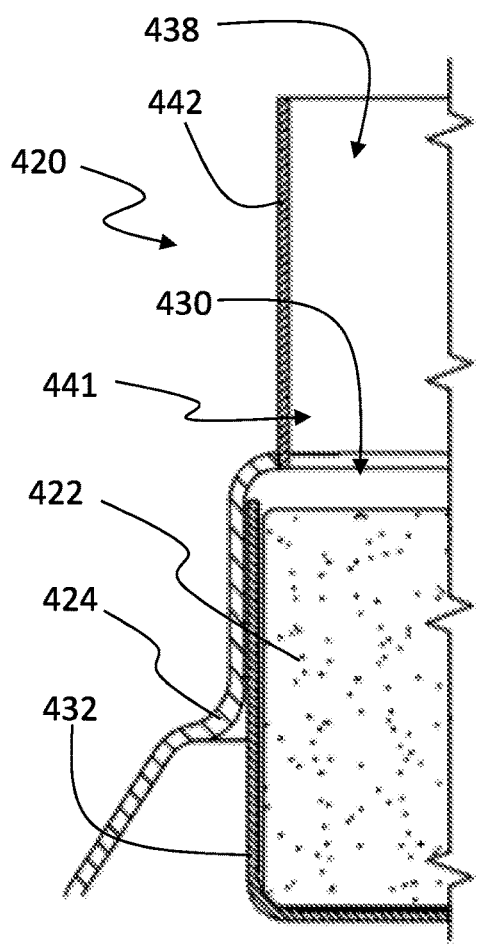
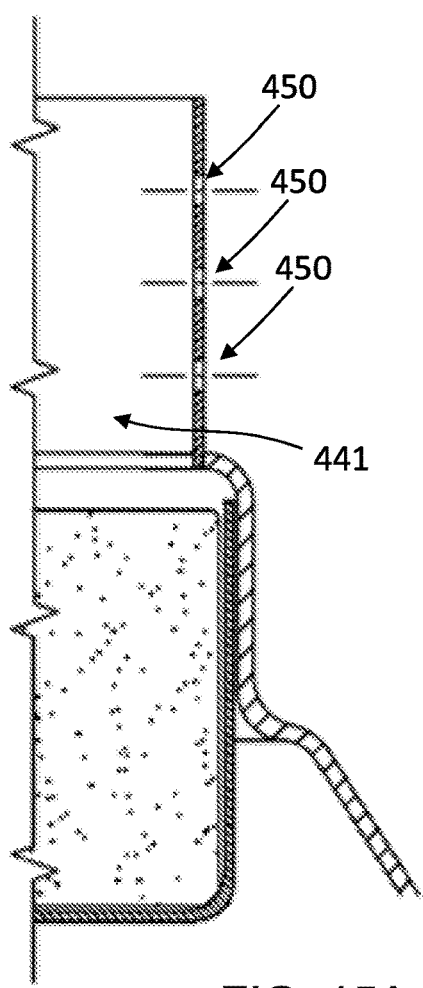
FIG. 14A  FIG. 15A

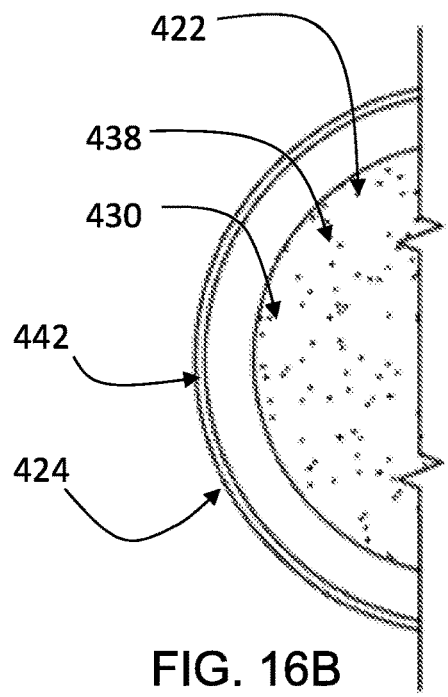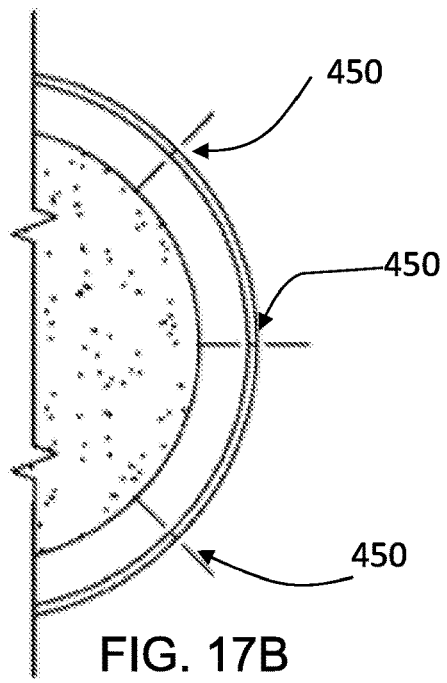
FIG. 16B  FIG. 17B
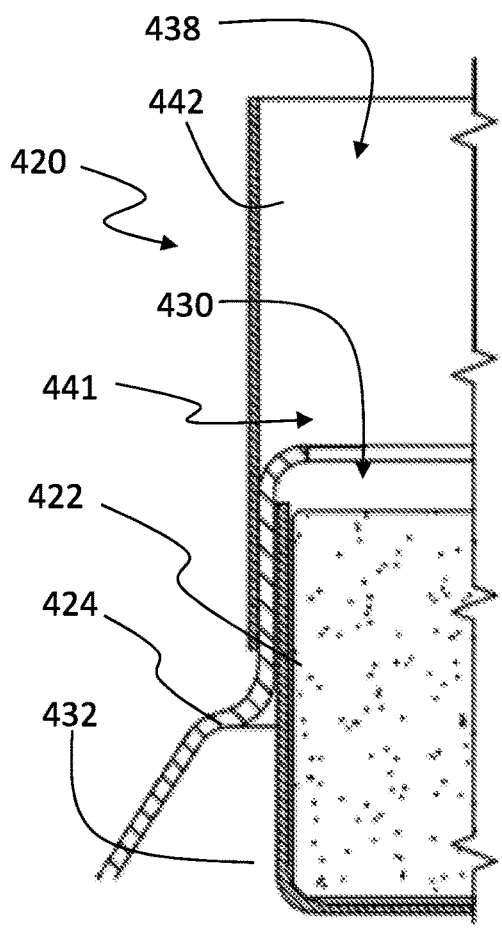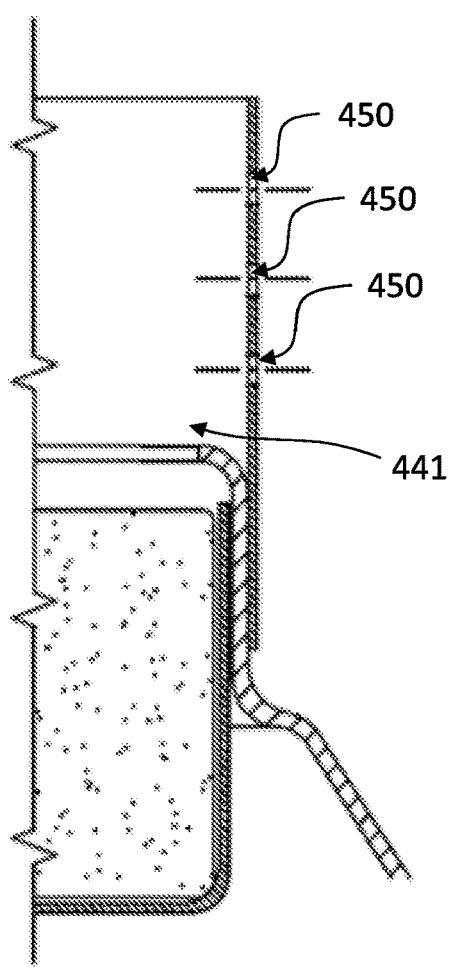
FIG. 16A  FIG. 17A

LOW WORK FUNCTION ELECTRON BEAM FILAMENT ASSEMBLY

CROSS-REFERENCE TO RELATED APPLICATION

This application claims the benefit of and priority to U.S. Provisional App. No. 62/509,103 filed May 20, 2017. This application is also a continuation-in-part of U.S. application Ser. No. 15/466,768 filed Mar. 22, 2017, which claims the benefit of and priority to U.S. Provisional App. No. 62/311,744 filed Mar. 22, 2016. The foregoing applications are incorporated herein by specific reference in their entirety.

FIELD

Some embodiments described herein generally relate to a simplified formation process of a low work function insert. Some embodiments described herein generally relate to filament having a low work function insert. Some embodiments described herein generally relate to an electron emitter having a low work function insert. Some embodiments described herein generally relate to an electron gun, such as those used in an additive manufacturing system, that includes a filament having a low work function insert.

BACKGROUND

Unless otherwise indicated herein, the materials described herein are not prior art to the claims in the present application and are not admitted to be prior art by inclusion in this section.

A hollow cathode device is an electron source used in plasma devices. Within a hollow cathode device, there is an insert, from which electrons can be thermionically emitted. One type of insert consists of tungsten that is partially filled with barium oxide, calcium oxide, and aluminum oxide among lesser constituents. Cathode inserts with barium oxide, calcium oxide, and aluminum oxide may be referred to as barium calcium aluminate cathode inserts. Some methods for making barium calcium aluminate cathode inserts involve numerous processing steps.

One type of hollow cathode insert consists of a porous tungsten matrix that is separately prepared to be 70-80 percent dense and 30-20 percent porous with an open pore structure. The porous cavities in the tungsten matrix are filled with a low work function barium-calcium-aluminate ceramic in a high temperature hydrogen furnace where the ceramic is liquefied and then pulled into the pores. The porous tungsten treated this way is referred to as having been impregnated with ceramic. In subsequent operation, a low work function occurs on the surface of the tungsten or on nearby surfaces if a monolayer or partial monolayer of atomic barium and oxygen atoms is present on the tungsten or nearby surface. During operation, barium and barium oxide are constantly supplied to the surface of the insert from the pores via the open pore structure. The barium and barium oxide are produced at the pores through chemical reactions between the ceramic and its lesser constituents and with the ceramic and the tungsten walls of the pores. The barium and barium oxide constantly evaporate from the surface of the tungsten and nearby surfaces as a result of the elevated operating temperature, but the aforementioned constant supply of barium and barium oxide from the interior regions of the insert continuously renew the surfaces so that the work function remains low. The addition of a small amount of scandium oxide into the ceramic can help convert the barium-calcium-aluminate mixture contained within each pore into barium and barium oxide without the need for intimate contact and chemical reaction with the tungsten walls of the pores.

Electron beam-based metal additive manufacturing technologies utilize filaments to thermionically emit a stream of electrons that are subsequently accelerated to high kinetic energy that melt metal powder or wires into thin layers. Successive layers of melted metal are added until a near net shape object is formed. The filaments currently used in additive manufacturing systems configured to melt feed wires are made from 0.005" or 0.007" thick sheets of tantalum (Ta) formed into a button-shaped, planar surface approximately 0.175" in diameter. The filament has legs leading to and from the flat button region which are used to connect the filament to electrodes. A direct current (DC) of ~50-75 amperes (A) flows through the filament legs to heat it to a temperature between 2100 to 2500 kelvin (K) where electrons are emitted thermionically and formed into a beam. At these temperatures, the filament slowly evaporates and the grains in the filament grow and distort its shape until it can no longer be used. This typically takes between 4 to 12 hours to occur in some 3D printing processes.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

A filament assembly can include a button having a planar emitter region with one or more apertures extending from an emission surface of the planar emitter region to an internal surface opposite of the emission surface. An inlet electrical lead can be coupled to the button at a first side. An outlet electrical lead can be coupled to the button at a second side opposite of the first side. A low work function object can be positioned adjacent to the internal surface of the planar emitter region and retained to the button. In some aspects, the planar emitter region comprises a plurality of apertures. In some aspects, the low work function object includes barium and is configured to evolve barium therefrom when heated. In some aspects, a retainer member is coupled with the button to form a housing having an internal chamber, wherein the low work function object is retained within the internal chamber. In some aspects, the retainer element is attached to the button such that no vapor can escape through the attachment region. In some aspects, at least one of the button or retainer member includes tantalum. In some aspects, a basket having the low work function object is located in the basket. In some aspects, the basket includes tantalum foil. In some aspects, the low work function object includes a porous ceramic material having the barium. In some aspects, the low work function object has a polished external surface.

In some embodiments, the porous ceramic material includes a refractory metal distributed with a ceramic that includes barium oxide, calcium oxide, and another oxide. The other oxide includes at least one of aluminum oxide, samarium oxide, or magnesium oxide. The refractory metal makes up at least 50% of the low work function object by weight. In some aspects, the refractory metal includes tungsten. In some aspects, the low work function object further comprises an additive metal that includes at least one of nickel, iridium, osmium, titanium, molybdenum, or tantalum.

In some embodiments, a cylindrical tantalum foil is associated with the button. In some aspects, the cylindrical tantalum foil extends from the button away from the low work function object.

In some embodiments, an electron gun can include: a cathode; the filament assembly of any of the embodiments adjacent to the cathode with a gap therebetween; and an anode spaced apart from the cathode.

In some embodiments, an additive manufacturing system can include: the electron gun having the filament of one of the embodiments; and a wire feeder configured to feed wire into a path of an electron beam emitted from the filament assembly.

In some embodiments, a method of emitting electrons from a filament assembly can include: providing the filament assembly of any of the embodiments; passing current from the inlet electrical lead through the filament assembly to the outlet electrical lead; and heating the filament until electrons are emitted from the planar emitter region of the button.

In some embodiments, a method of improving function of a filament assembly can be performed, which can include: decontaminating the button by flash heating the button to a first temperature that vaporizes one or more contaminants such that the low work function object is at a second temperature that is lower than the first temperature so that barium is not evolved therefrom; cooling the button to an operational temperature; and heating the low work function object to the operational temperature.

A method of manufacturing the filament assembly of any of the embodiments can include: forming the button to have a body with a planar emitter region; forming the one or more apertures through the body at the planar emitter region; positioning the low work function object adjacent to the internal surface of the planar emitter region; and attaching the inlet electrical lead and outlet electrical lead to opposite sides of the button. The manufacturing method can also include polishing the low work function object by one of: abrasive polishing with a dry abrasive; ion beam polishing; or abrasive polishing with a dry abrasive followed by ion beam polishing.

Additional features and advantages of the disclosure will be set forth in the description which follows, and in part will be obvious from the description, or may be learned by the practice of the disclosure. The features and advantages of the disclosure may be realized and obtained by means of the instruments and combinations particularly pointed out in the appended claims. These and other features of the present disclosure will become more fully apparent from the following description and appended claims, or may be learned by the practice of the disclosure as set forth hereinafter.

BRIEF DESCRIPTION OF THE DRAWINGS

To further clarify the above and other advantages and features of the present disclosure, a more particular description of the disclosure will be rendered by reference to specific embodiments thereof which are illustrated in the appended drawings. It is appreciated that these drawings depict only typical embodiments of the disclosure and are therefore not to be considered limiting of its scope. The disclosure will be described and explained with additional specificity and detail through the use of the accompanying drawings in which:

FIG. 2 is a cross-sectional view of an example crucible in which a mixture of ceramic constituents and one or more refractory metals may be heated to form a low work function insert;

FIG. 3A illustrates an example vacuum furnace to heat a mixture in a crucible;

FIG. 3B illustrates an example air furnace to heat a mixture in a crucible;

FIG. 8 is a cross-sectional view of three example cathode tubes which may be implemented in the hollow cathode devices of FIGS. 6 and 7;

FIGS. 9A and 9B include cross-sectional views of a low work function insert co-fired with an open-ended crucible cup and a cathode tube;

FIG. 11D includes a side view of an elongated cylindrical basket showing the button on top and the insert therein;

FIG. 14A includes a cross-sectional elevation view of an electron source implemented as a filament with a single large hole in an election emission surface and a cylindrical extension;

FIG. 14B includes an overhead view of the filament of FIG. 14A;

FIG. 15A includes a cross-sectional elevation view of an electron source implemented as a filament with a single large hole in an election emission surface and a cylindrical extension with side apertures;

FIG. 15B includes an overhead view of the filament of FIG. 15A;

FIG. 16A includes a cross-sectional elevation view of an electron source implemented as a filament with a single large hole in an election emission surface and a cylindrical extension mounted to sides of the filament;

FIG. 16B includes an overhead view of the filament of FIG. 16A;

FIG. 17A includes a cross-sectional elevation view of an electron source implemented as a filament with a single large hole in an election emission surface and a cylindrical extension with side apertures mounted to sides of the filament;

FIG. 17B includes an overhead view of the filament of FIG. 17A;

DETAILED DESCRIPTION OF SOME EXAMPLE EMBODIMENTS

Some embodiments described herein generally relate to a simplified formation process of a low work function insert, as well as to low work function inserts themselves and/or electron sources that include such low work function inserts. In an example implementation, a combination of powders that include barium, calcium, aluminum (or other suitable substitute), tungsten (or other suitable substitute) are mixed in particular ratios and heated in an oxygen poor environment to form a porous, bulk insert. The low work function of the insert allows electrons to be readily extracted from its surface.

Embodiments described herein eliminate many of the steps included in some other methods of making barium calcium aluminate cathode inserts. For instance, embodiments described herein do not require pre-formation of a porous tungsten matrix or heating the porous tungsten matrix with the barium-calcium-aluminate ceramic in a hydrogen atmosphere to liquefy and pull the ceramic into the pores of the porous tungsten matrix.

Reference will now be made to the drawings to describe various aspects of some example embodiments of the disclosure. The drawings are diagrammatic and schematic representations of such example embodiments, and are not limiting of the present disclosure, nor are they necessarily drawn to scale.

Figure 1:
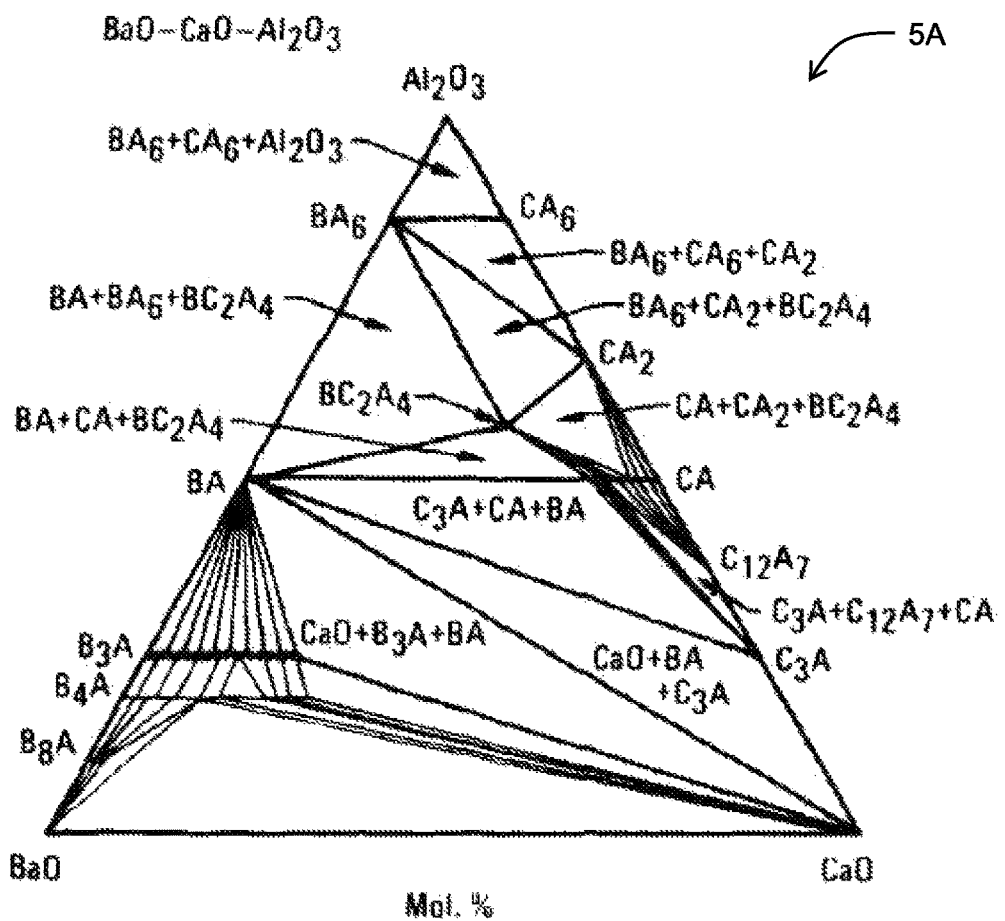
FIG. 1 depicts a ternary plot of the barium oxide, calcium oxide, and aluminum oxide ternary system.
Figure 1:
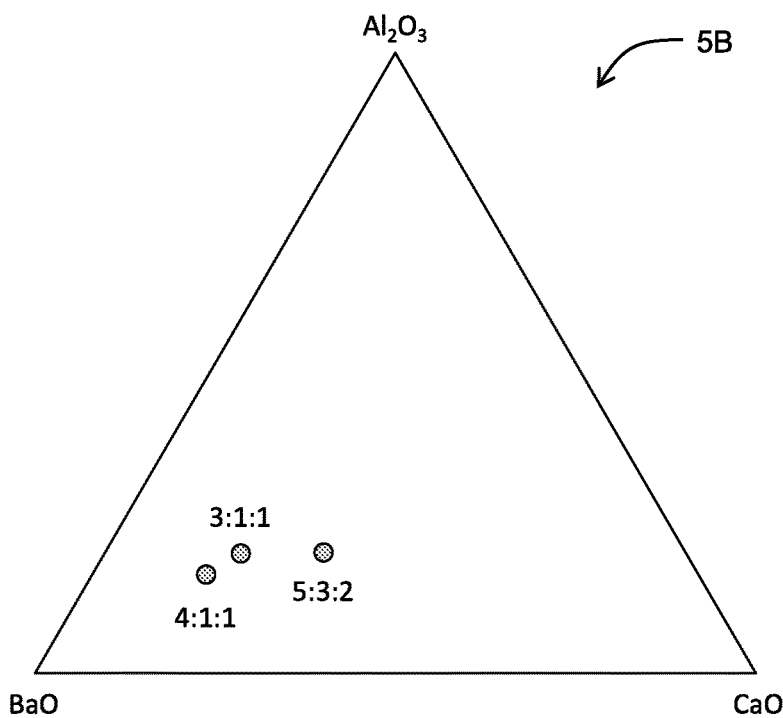

FIG. 1 depicts a ternary plot 5A of the barium oxide (BaO), calcium oxide (CaO), and aluminum oxide ($Al_2O_3$) ternary system with various specific combinations of the foregoing denoted throughout, arranged in accordance with at least one embodiment described herein. Combinations of barium oxide, calcium oxide, and aluminum oxide in one or more suitable ratios are examples of a ceramic that in combination with one or more refractory metals may form a low work function insert which may be made and/or used as described herein. In other embodiments, additives may be included, such as scandium oxide, and/or the aluminum oxide may be replaced with magnesium oxide, samarium oxide, or other suitable oxide.

FIG. 1 additionally depicts a simplified ternary plot 5B with three example starting atomic ratios that may be suitable to form a low work function insert according to some embodiments. For instance, a typical starting atomic mixture ratio of interest is 5 parts barium oxide (BaO), 3 parts calcium oxide (CaO), and 2 parts aluminum oxide ($Al_2O_3$), referred to as a 5:3:2 mixture, which is equivalent to a ratio of barium atoms to calcium atoms to aluminum atoms of 5:3:4. For other ratios described herein and according to the ternary plots 5A and 5B of FIG. 1, it is assumed that aluminum atoms are contributed in pairs (hence the use of "$Al_2O_3$" at the top vertex of the ternary plots 5A and 5B). A low work function insert formed according to such a starting atomic ratio may be referred to as a 5:3:2 insert. Scandium may be added to the ceramic in a small amount, for instance 0.5 parts scandium to the same 5:3:2 mixture of barium, calcium, and paired aluminum to create a 5:3:2:0.5 mixture. Other mixture ratios that may be of interest, and that may be made according to embodiments described herein, are 4:1:1 and 3:1:1, both of which are depicted in the simplified ternary plot 10B of FIG. 1, and/or 6:1:2 or 8:2:3:0.3. Any other suitable mixture ratio may be made according to the embodiments described herein.

Tungsten and the ceramic mixture are combined such that the tungsten may make up 50 to 95 percent by weight of the combined mixture of the tungsten and ceramic mixture. In some embodiments, tungsten and the ceramic mixture are combined such that tungsten makes up 75 to 95 percent by weight of the combined mixture of the tungsten and ceramic mixture. In some embodiments of the invention, other metal powders may be added to the tungsten. For example, iridium as an additive with tungsten may result in lower work functions than tungsten without iridium. Alternatively or additionally, nickel may be included as an additive (e.g., in an amount of 0.5 percent by weight) with tungsten. Other metal powders, such as osmium, titanium, molybdenum, and tantalum may also be used, including in combination with each other and with iridium, and with tungsten.

The above example assumes that tungsten makes up the majority of the metal combined with the ceramic mixture. The metal that makes up all or the majority of the metal combined with the ceramic mixture may be referred to as the primary metal. Tungsten is only one example of a suitable primary metal. More generally, the primary metal that is combined with the ceramic mixture may include any suitable refractory metal, such as tungsten, molybdenum, tantalum, iridium, osmium, or titanium. In these and other embodiments, a metal that is added to the combined mixture of the primary metal and the ceramic mixture may be referred to as an additive metal. The additive metal may include a different metal than the primary metal and may include tungsten, nickel, iridium, osmium, titanium, molybdenum, or tantalum.

In addition, the ceramic mixture is discussed above as including barium oxide, calcium oxide, and aluminum oxide. More generally, the ceramic mixture may include barium, calcium, and a third metal such as aluminum, samarium, or magnesium, with or without additives. The barium, the calcium, and the third metal, with or without any additives, may be referred to in aggregate as the ceramic constituents. The ceramic constituents and one or more refractory metals (e.g., primary metal with or without additive metal(s)) may be combined and/or mixed in any order and it is not necessary that the ceramic constituents be combined and mixed together before being combined with the one or more refractory metals.

In some embodiments, one or more of the ceramic constituents may be included in a corresponding precursor compound. The ceramic mixture and/or the combined mixture may thus include one or more precursor compounds that include one or more corresponding ceramic constituents and/or one or more ceramic constituents not included in one or more corresponding precursor compounds. During heating of the combined mixture, a given precursor compound may decompose into a corresponding oxide and one or more gases. Various example precursor compounds are described elsewhere herein.

Accordingly, a method to form a low work function insert may include preparing a mixture that includes a first powder that contains barium, a second powder that contains calcium, a third powder that contains at least one of aluminum, samarium, or magnesium, and a fourth powder that contains a refractory metal. The mixture may be placed in a crucible, or mixed in place in the crucible, and then heated in the crucible within a furnace where oxygen concentration is maintained at a low partial pressure during heating of the mixture in the furnace. In some embodiments, low partial pressure of oxygen may refer to a partial pressure of oxygen of less than $10^{-3}$ Torr. Heating the mixture may convert the mixture from a powder compound to a porous compound. The porous bulk compound may be solid in the sense that it may be generally firm and stable in three dimensional shape, notwithstanding the porous compound may have some porosity. The porous compound may be removed from the crucible, or left in place in the crucible, and coupled to an electron emitter of an electron source. Alternatively or additionally, the porous compound may be machined to a machined shape after removal from the crucible. Additional details regarding the foregoing and/or other embodiments are described with respect to the Figures that follow.

FIG. 2 is a cross-sectional view of an example crucible 8 in which a mixture 14A of ceramic constituents and one or more refractory metals may be heated to form a low work function insert 14B, arranged in accordance with at least one embodiment described herein. In more detail, in an example embodiment, a barium containing compound, a calcium containing compound, aluminum oxide (or other oxide), scandium (III) oxide (which may be omitted in some embodiments), and tungsten (or other primary and/or additive refractory metal(s)) are mixed in a particular ratio and/or in particular amounts in powder form to form a mixture 14A. The mixture 14A is transferred into a crucible 8. In an example implementation, the crucible 8 is a graphite crucible and will be referred to hereinafter as a graphite crucible; one or more other materials may be used instead of or in addition to graphite for this or other crucibles described herein so long as the one or more materials can withstand heating temperatures as described herein and do not react with the mixture 14A or any of its constituents.

The graphite crucible 8 in FIG. 2 includes a cup 10 and a cap 12. An inner diameter 16 of the cup 10 is slightly larger than an outer diameter 17 of an inset portion of the cap 12, such that a fit of the cap 12 into the cup 10 may be snug, but still gas permeable. The mixture 14A is transferred into the cup 10, such that the mixture 14A at minimum fills the volume of the cup 10 to a point where a bottom of the cap 12 would sit against a top surface of the mixture 14A when the cap 12 is assembled into the cup 10. The cup 10 can be overfilled such that compressing the cap 12 into the 10 cup may also compress the mixture 14A. Any shape crucible may be used so long as the crucible allows effusion of gaseous reaction products. During heating of the mixture 14A in the graphite crucible 10 within a furnace, the mixture 14A as a powder compound may be converted to a porous compound, which may in some embodiments then be removed from the graphite crucible 8 as the low work function insert 14B with a porous, bulk form.

In some embodiments, pressure may be applied by and/or current may flow through the graphite crucible 8 (or other crucibles described herein) during the heating process. For instance, the cap 12 and/or the graphite crucible 8 may be adapted to apply pressure axially, e.g., along the vertical axis of the graphite crucible in FIG. 2, to the mixture 14A and/or to flow current through the mixture 14A during the heating process.

FIG. 3A illustrates an example vacuum furnace 20 to heat a mixture (not visible in FIG. 3A) in a crucible 24, arranged in accordance with at least one embodiment described herein. The crucible 24 may include or correspond to the crucible 8 of FIG. 2. The crucible 24 may contain a mixture of ceramic constituents and one or more refractory metals, such as the mixture of 14A of FIG. 2. The vacuum furnace 20 may generally include a heated section 22 and a vacuum pump 26.

The crucible 24, containing the mixture, is inserted into the heated section 22 of the vacuum furnace 20. In at least one embodiment, the vacuum pump 26 includes a high vacuum pump and is used to evacuate the vacuum furnace 20 to a pressure less than about $1 \times 10^{-3}$ Torr ($1.3 \times 10^{-1}$ Pa) or more generally to a pressure less than a threshold pressure. The heated section 22 of the vacuum furnace 20 may be used to heat the crucible 24 containing the mixture to a peak temperature at a first rate, e.g., by increasing the temperature within the heated section 22 at the first rate from an initial temperature to the peak temperature. The initial temperature may include room temperature, which may generally refer to an ambient temperature in a location at which the vacuum furnace 20 is located. In an example, room temperature may be in a range from 20 to 25° C., or higher or lower. The peak temperature may be in a peak temperature range between 1400 to 1750° C., or higher or lower than the peak temperature range. In some embodiments, the peak temperature range may be between 1500 to 1700° C. The first rate may be in a first heating rate range from 15-35° C. per minute or higher or lower than the first heating rate range. The first rate may be constant as the temperature is increased, or the first rate may vary as the temperature is increased from the initial temperature to the peak temperature.

The temperature of the crucible 24 may be maintained at the peak temperature, or at least in the peak temperature range, for a peak temperature hold time. The peak temperature hold time may be in a range from 5 to 60 minutes. Alternatively, a peak temperature hold time shorter than 5 minutes or longer than 60 minutes may be acceptable. In some embodiments, the peak temperature hold time is in a range from 10 to 30 minutes.

After completion of the peak temperature hold time, the crucible 24 containing the mixture may then be cooled to a final temperature at a second rate, e.g., the temperature may be decreased from the peak temperature to the final temperature at the second rate from the peak temperature to the final temperature. The final temperature may include room temperature or some other temperature. The second rate may be in a second heating rate range from 10-35° C. per minute or higher or lower than the second heating rate range. The second rate may be constant as the temperature is decreased, or the second rate may vary as the temperature is decreased from the peak temperature to the final temperature.

FIG. 3B illustrates an example air furnace 30 to heat a mixture (not visible in FIG. 3B) in a crucible 34, arranged in accordance with at least one embodiment described herein. The crucible 34 may include or correspond to the crucible 8 of FIG. 2. The crucible 34 may contain a mixture of ceramic constituents and one or more refractory metals, such as the mixture of 14A of FIG. 2. The air furnace 30 may generally include a heated section 32.

The crucible 34, containing the mixture, is placed inside a ceramic container 36, after which the ceramic container 36, the crucible 34, and the mixture are inserted into the heated section 32 of the air furnace 30. Analogous to the crucible 34, the ceramic container 36 may include a cup and cap. Both the crucible 34 and the ceramic container 34 may be gas permeable, at least at the interface between the corresponding cup and cap. Enclosing the mixture within both the crucible 34 and the ceramic container 36 and constructing the crucible 34 out of graphite or graphite containing material or other materials that behave similar to graphite (e.g., tantalum, molybdenum, tungsten) may help maintain oxygen concentration in a vicinity of the mixture at a low partial pressure during heating within the air furnace 30.

Analogous to the embodiment of FIG. 3A, in the embodiment of FIG. 3B, the temperature within the air furnace 30 may be increased from an initial temperature to a peak temperature, the temperature may be maintained at the peak temperature during a peak temperature hold time, and the temperature may be decreased from the peak temperature to a final temperature. The initial temperature, the peak temperature, the final temperature, and/or the peak temperature hold time in the embodiment of FIG. 3B may be the same as or different than in FIG. 3A.

The increase and/or decrease of the temperature may be continuous. Alternatively, the increase and/or decrease of the temperature may proceed in a stepwise manner. In an example stepwise implementation, the temperature within the air furnace 30 is increased to a first temperature (e.g., 100° C.) and held at the first temperature for a first hold time (e.g., one minute). This pattern of increasing to a particular temperature and holding at that temperature for a hold time may be repeated a total of N times prior to a final ramp up to a peak temperature. For instance, N may be 6 in which case the temperature may be increased to 100° C., 200° C., 300° C., 400° C., 500° C., and then 600° C. while holding at the corresponding temperature for the hold time before increasing to the next corresponding temperature. The difference between each successive temperature may be 100° C. as in this example, or some other difference and/or may not be the same from one temperature to the next.

After reaching 600° C. (or some other intermediate value between the initial temperature and the peak temperature), the temperature within the air furnace 30 may be increased to 1500-1700° C. (such as 1650° C.) or some other peak temperature and held at the peak temperature for 5 to 60 minutes (such as 30 minutes), or some other peak temperature hold time.

After the peak temperature hold time is over, the temperature within the air furnace 30 may be decreased from the peak temperature to the final temperature. For instance, the air furnace 30 may be turned off to allow the ceramic container 36, the crucible 34, and the mixture contained in the crucible to cool naturally. Alternatively or additionally, the decrease in temperature may be actively controlled by the air furnace 30.

As mentioned above, one or more of the ceramic constituents may be included in a corresponding precursor compound that decomposes under heating to a corresponding oxide and one or more gases. As an example, the barium containing compound may be selected among barium carbonate ($BaCO_3$), barium hydroxide monohydrate ($Ba(OH)_2$ ($H_2O$)), or barium hydroxide octahydrate ($Ba(OH)_2(H_2O)_8$). The calcium containing compound may be selected among calcium carbonate ($CaCO_3$) or calcium hydroxide ($Ca(OH)_2$). During the heating phase (e.g., within the vacuum furnace 20 or the air furnace 30 of FIGS. 3A-3B), barium carbonate may thermally decompose into barium oxide and carbon dioxide ($CO_2$) at temperatures above about 850° C. Similarly, barium hydroxide may thermally decompose into barium oxide at temperatures above about 750° C. Calcium carbonate may thermally decompose into calcium oxide and carbon dioxide at temperatures above about 840° C. Calcium hydroxide may thermally decompose into calcium oxide at temperatures above about 400° C. The rate of decomposition of any of the foregoing precursor compounds may be a function of temperature, and the conversion of barium carbonate or barium hydroxide monohydrate or octahydrate to barium oxide and of calcium carbonate or calcium hydroxide to calcium oxide may occur over several minutes during the heating phase as the temperature rises above the corresponding precursor compound's decomposition point. The gases such as carbon dioxide generated from decomposition may in some cases be constantly evacuated from the heated region 22 in the case of the vacuum furnace 20 after passing through the crucible 24 (e.g., through the gas permeable interface between the cup and cap of the crucible 24). Alternatively, in the case of the air furnace 30, the gases generated from decomposition may pass through the crucible 34, the ceramic container 36, and disperse into and out of the air furnace 30.

Still referring to the heating process, a feature of some embodiments described herein is a one-step process where the barium carbonate, calcium carbonate, and aluminum oxide powders (or other barium-, calcium-, and/or other metal-containing ceramic constituent powders) do not need to be pre-treated in a separate step prior to incorporating them with the tungsten powder (or other primary refractory metal and/or one or more additive metal powders) and the tungsten does not have to be pre-formed into an open porous structure in many separate steps prior to being impregnated with ceramic. For instance, in some other processes to form a low work function insert, the ceramic constituent powders are pre-mixed in the absence of any tungsten and then heated in air to a peak temperature of about 1350° C. for several hours to a) convert barium carbonate and calcium carbonate to barium oxide and calcium oxide and b) form multi-phase solutions of barium, calcium, and aluminum oxide. In such processes, they are re-crushed into a powder and mixed with a binder and then applied to the surface of the open porous tungsten matrix and impregnated into the open porous matrix through a heat treatment process in a wet and then dry hydrogen atmosphere at a temperature of approximately 1800° C.

In some embodiments described herein, however, the barium carbonate, calcium carbonate, and aluminum oxide powders (or other barium-, calcium-, and/or aluminum-containing powders) can be directly mixed with tungsten powder and heated in a single step to form a low work function insert. In other embodiments described herein, a pretreatment may be performed, such as by first treating the barium-, calcium-, and aluminum-containing powders at 1350° C. in air for several hours in the absence of tungsten, then mixing those powders with tungsten powder, and then heating the powdered mixture to form a porous low work function insert; still without the hydrogen atmosphere impregnation step or the porous tungsten matrix formation step followed by a separate ceramic impregnation step of some other low work function insert formation processes.

Referring back to the graphite crucible 8 of FIG. 2, and as already mentioned, after the heating process the powdered mixture 14A may be converted into a porous compound as the low work function insert 14B that, in this example, may contain a multiphase ceramic (made up of barium oxide, calcium oxide, aluminum oxide, and scandium oxide) uniformly distributed with tungsten. Different regions of the low work function insert 14B may include different phases of the ceramic. The porous compound low work function insert 14B may typically be lightly adhered to surfaces of the graphite cup 10 and graphite cap 12 of the graphite crucible 8, and may be separated with gentle tapping or by running a sharp blade around the interface between the low work function insert 14B and the graphite cup, or in any other suitable manner. An outer diameter 19 of the low work function insert 14B may be the same or nearly the same as the inner diameter 16 of the cup 10. Similarly, a height 21 of the low work function insert 14B may be the same or nearly the same as a height 18 of the enclosed space between the bottom of the cap 12 and the bottom of the cup 10 when the graphite crucible 8 is closed.

In some ceramic-impregnated low work function inserts, all the tungsten or other refractory metal is interconnected to itself as a result of forming the porous tungsten matrix first, follow by impregnation with ceramic. As such, any two points on an exterior surface of the low work function insert as a whole may be interconnected on the surface by a continuous run (however indirect) of tungsten. In comparison, low work function inserts according to embodiments described herein may have discontinuous regions of tungsten or other refractory metal such that any two points on an exterior surface of such low work function inserts may not be interconnected on the surface by a continuous run of tungsten as a result of the different low work function formation process described herein.

Figure 4:
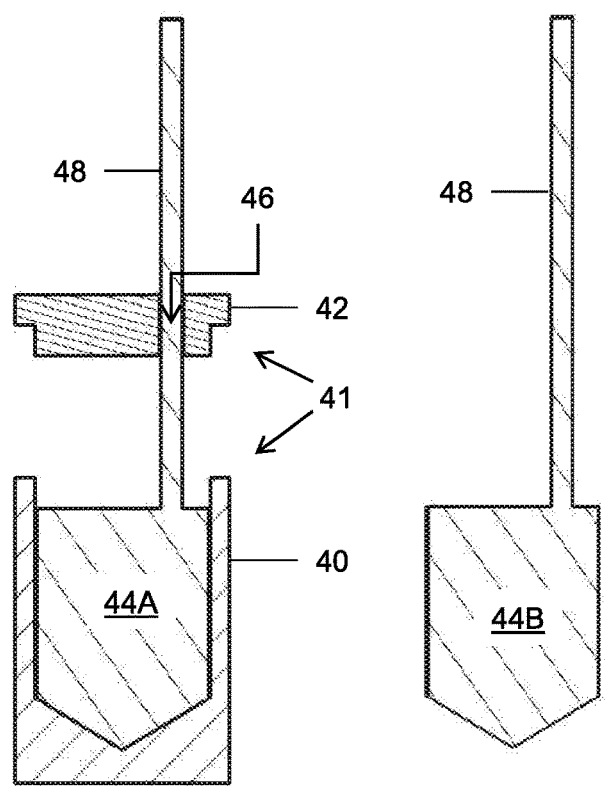
FIG. 4 is a cross-sectional view of another example crucible in which a mixture of ceramic constituents and one or more refractory metals may be heated to form a low work function insert with one or more embedded wires or leads.

In some embodiments, a low work function insert may be formed with an embedded wire. For instance, FIG. 4 is a cross-sectional view of another example crucible 41 in which a mixture 44A of ceramic constituents and one or more refractory metals may be heated to form a low work function insert 44B with one or more embedded wires or electrical leads 48 (hereinafter "wire 48"), arranged in accordance with at least one embodiment described herein.

The crucible 41 includes a cup 40 and a cap 42. The cup 40 and the cap 42 may generally by similar to the cup 10 and cap 12 of FIG. 2, except that the cap 42 defines a hole 46. Prior to heating the crucible 41 and the mixture 44A in a furnace, the wire 48 (or a collection of multiple wires) may be passed through the hole 46 of the cap 42 and into the mixture 44A. During the heating process, the wire 48 becomes embedded into the solidified porous low work function insert 44B. Although a single hole 46 is depicted in FIG. 4, more generally the cap 42 may define any number of holes 46, each of which may accommodate one or more wires or leads.

The wire 48 may be made of tantalum, tungsten, or other metals or materials. In embodiments that include the wire 48 embedded in the low work function insert 44B, the wire 48 may be welded to a cathode tube or other electron emitter to both a) make good electrical contact between the cathode tube and the low work function insert 44B, and b) hold or otherwise secure the low work function insert 44B in a specific location along an axial length of the cathode tube. More particularly, the low work function insert 44B may be secured relative to the cathode tube such that there is a specific distance between a downstream surface of the low work function insert 44B and an upstream surface of a cathode tube orifice of the cathode tube.

Figure 5:
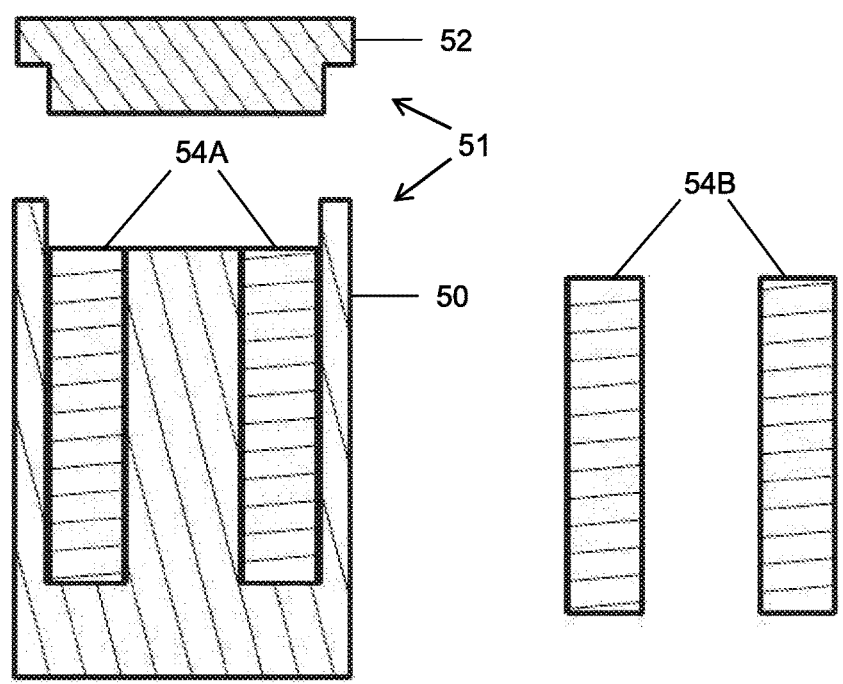
FIG. 5 is a cross-sectional view of another example crucible in which a mixture of ceramic constituents and one or more refractory metals may be heated to form a low work function insert.

FIG. 5 is a cross-sectional view of another example crucible 51 in which a mixture 54A of ceramic constituents and one or more refractory metals may be heated to form a low work function insert 54B, arranged in accordance with at least one embodiment described herein. The crucible 51 includes a cup 50 and a cap 52, which may generally be similar or analogous to the cup 10 and cap 12 of FIG. 2. In the example of FIG. 5, however, the cup 50 defines a tubular volume filled by the mixture 54A in FIG. 5. After the heating process is performed, a porous compound is formed in a tubular shape as the low work function insert 54B. The cap 52 may lack any holes similar to the cap 12 of FIG. 2. Alternatively, the cap 52 may define one or more holes, similar to the cap 42 of FIG. 4, to accommodate one or more wires to be embedded in the low work function insert 54B. In the examples of FIGS. 2, 4, and/or 5, a plug- or ingot-shaped low work function insert 14B or 44B and/or a tubular-shaped low work function insert 54B may be formed with or without one or more embedded wires 48 in a single heating step or at least in fewer heating steps than in other low work function insert formation processes that involve a previously formed porous tungsten piece impregnated with ceramic.

Figure 6:
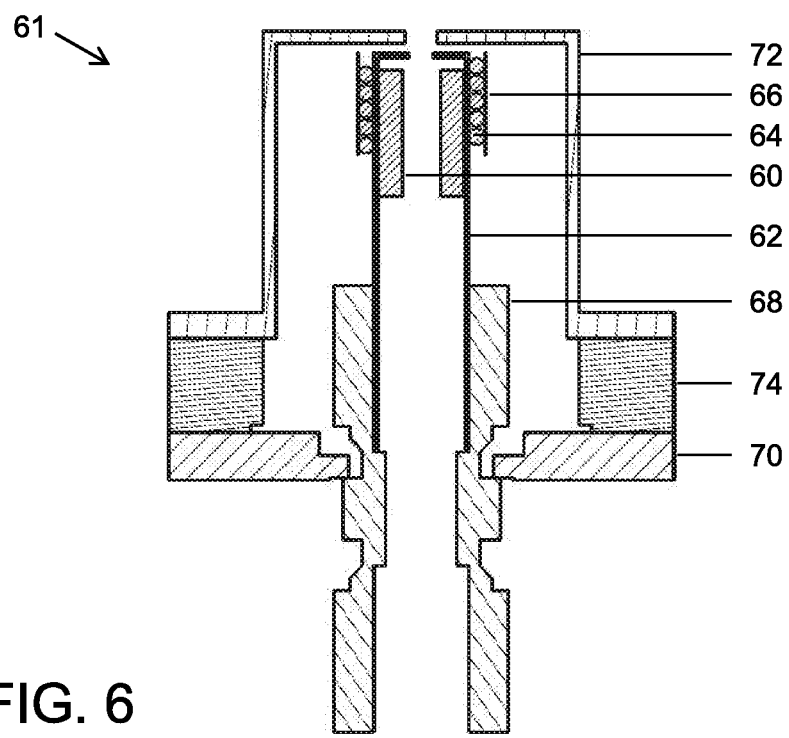
FIG. 6 is a cross-sectional view of an example hollow cathode device that may include a low work function insert.

FIG. 6 is a cross-sectional view of an example hollow cathode device 61 that may include a low work function insert 60, arranged in accordance with at least one embodiment described herein. The hollow cathode device 61 may include the low work function insert 60, a cathode tube 62, a heater wire 64, a radiation foil 66, a compression fitting 68, a mounting structure 70, a keeper electrode 72, and an insulator 74.

The low work function insert 60 may generally be formed according to one or more of the processes described herein and/or may generally include or correspond to the low work function inserts 14B, 44B, 54B described herein. In particular, the low work function insert 60 in FIG. 6 has a tubular shape, similar to the low work function insert 54B of FIG. 5.

The low work function insert 60 is positioned near a downstream end of the cathode tube 62 in FIG. 6, which cathode tube 62 may be thin-walled in some embodiments. The coaxial heater wire 64 is wrapped around the downstream end of the cathode tube 62 to pre-heat the low work function insert 60 prior to device ignition. The radiation foil 66 is wrapped around the coaxial heater wire 64, or in the absence of the heater wire 64 may be wrapped around the downstream end of the cathode tube 62. Neither the heater wire 64 nor the radiation foil 66, however, are required to operate hollow cathode devices with the low work function inserts made according to the embodiments described herein. The cathode tube 62 is attached to the mounting structure 70, for example using the compression fitting 68. Downstream of the cathode tube 62 is the keeper electrode 72. The keeper electrode 72 is electrically isolated from the cathode tube 62 using the insulator 74.

The cathode tube 62 may include tantalum, tungsten, molybdenum, molybdenum-rhenium, or titanium, or any combination thereof. The heater wire 64 may be made of tantalum arranged in a coaxial manner with a high temperature ceramic insulator between an outer heater sheath and an inner central wire often referred to as a filament 62, even though this filament is entirely enclosed within the heater outer sheath and ceramic insulator. The keeper electrode 72 may include graphite. The insulator 74 may include alumina ceramic, steatite ceramic, macor ceramic, or boron nitride. The mounting structure 70 and the compression fitting 68 may include stainless steel or titanium. The keeper electrode 72 may include graphite because graphite has a low sputter yield. More generally, the keeper electrode 72 may include one or more of tantalum, molybdenum, tungsten, titanium, or stainless steel. There may be a set gap between the downstream end of the low work function insert 60 and the downstream end of the cathode tube 62, and another set gap between the downstream end of the cathode tube 62 and the downstream end of the keeper electrode 72. As an example, the set gap between the downstream end of the low work function insert 60 and the downstream end of the cathode tube 62 may be in a range from 1 mm to 3 mm, or less than 1 mm or greater than 3 mm. As another example the set gap between the downstream end of the cathode tube 62 and the downstream end of the keeper electrode 72 may be in a range from 2 mm to 5 mm, or less than 2 mm or greater than 5 mm.

For low work function inserts formed in crucibles as described with respect to e.g., FIGS. 2-5, it is not necessary to separate the low work function insert from the crucible before using the insert in a hollow cathode device such as the hollow cathode device 61 of FIG. 6. In these and other embodiments, the crucible cup containing the low work function insert, with an exposed area of the low work function insert surface on its downstream end, can be placed within the cathode tube. Additionally, the low work function insert may include embedded wires as in FIG. 4 and realize the benefits of the wires as in the case where the low work function insert and crucible are separated.

With continued reference to FIG. 6, process gas may flow into an upstream end (bottom end in FIG. 6) of the cathode tube 62, through a downstream orifice of the cathode tube 62, and exits through an orifice of the keeper electrode 72. A combination of momentary high gas flow in some embodiments of between 25 and 50 standard cubic centimeters per minute (sccm) and high voltage biasing in some embodiments between 400 and 1800 volts (V) allows the hollow cathode device 61, using the low work function insert 60 or other low work function inserts as described herein, to start readily in the absence of the use of the heater wire 64 to pre-heat the cathode tube 62. To ignite plasma discharge regions within the cathode tube 62 and downstream of the cathode tube 62, a high positive voltage, on the order of 400 to 1800 V, is applied to the keeper electrode 72 relative to a voltage of the cathode tube 62. In conjunction with the high voltage bias, a high level of gas flow is momentarily sent through the cathode tube 62 and therefore into a region between the cathode tube orifice and the keeper electrode 72. The momentary high level of gas flow can be created, for example, using a mass flow controller capable of high flow rate, or by quickly releasing a stored mass of gas into the cathode tube 62. A plasma discharge starts between the cathode tube 62 and the keeper electrode 72, and the electron current flowing to the keeper electrode 72 is immediately regulated to a fixed value, typically 200 to 2,000 milliamps (mA), at a reduced voltage bias. In a relatively short period of time of between fractions of a second to several seconds, the plasma discharge heats the cathode tube 62, and the low work function insert 62 within the cathode tube 62, to a temperature at which significant thermionic electron emission occurs. A second voltage bias may be applied sequentially or simultaneously to the keeper electrode 72 bias between the cathode tube 62 and an anode surface that is external to the hollow cathode device 61 to draw electrons through the orifice of the keeper electrode 72. The electron current flowing from the cathode device 61 is then also typically current regulated, at reduced voltage bias, to a value of many amperes. Additional details regarding some example hollow cathode devices that may be implemented with low work function inserts as described herein are described in U.S. Pat. No. 9,305,733 (hereinafter the '733 patent), which is incorporated herein by reference.

Figure 7:
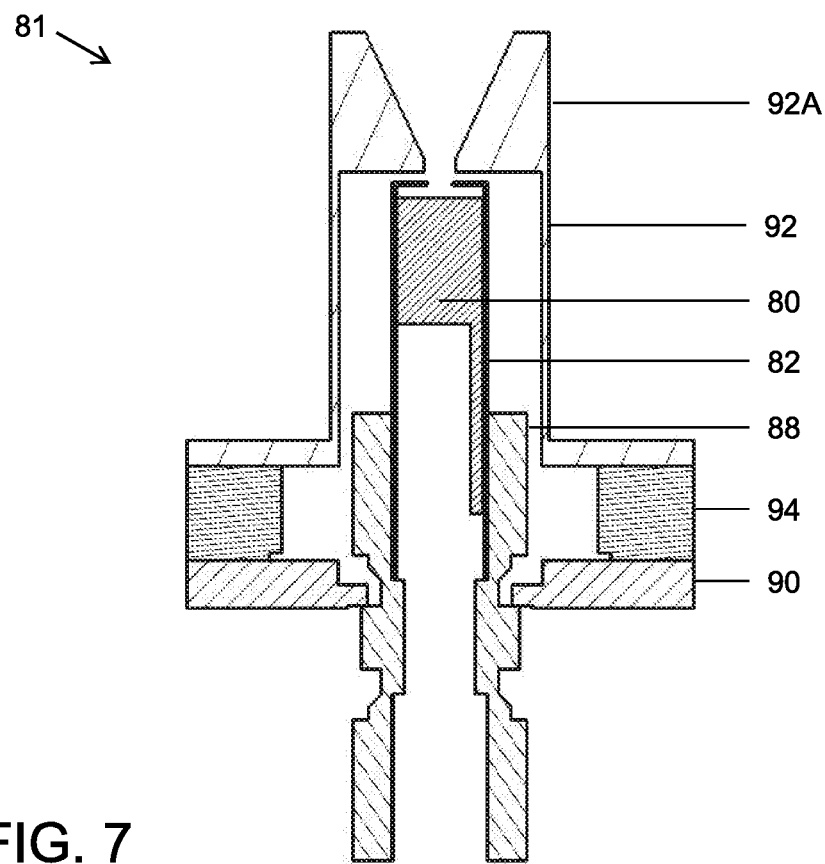
FIG. 7 is a cross-sectional view of another example hollow cathode device that may include a low work function insert.

FIG. 7 is a cross-sectional view of another example hollow cathode device 81 that may include a low work function insert 80, arranged in accordance with at least one embodiment described herein. The hollow cathode device 81 may include the low work function insert 80, a cathode tube 82, a compression fitting 88, a mounting structure 90, a keeper electrode 92, and an insulator 74.

The low work function insert 80, the cathode tube 82, the compression fitting 88, the mounting structure 90, the keeper electrode 92, and the insulator 74 of FIG. 7 may be the same as or similar to similarly named components of FIG. 6, except as otherwise noted. For instance, the low work function insert 80 of FIG. 7 is illustrated as a porous insert with an embedded wire 82, which may be used to electrically couple the low work function insert 80 to the cathode tube 82 and/or to secure the low work function insert 80 to the cathode tube 82 at a particular position longitudinally along the length of the cathode tube 82.

As another example, compared to the keeper electrode 72 of FIG. 6, the keeper electrode 92 of FIG. 7 may have a smaller inner diameter such that the keeper electrode 92 fits more closely around the cathode tube 82 compared to FIG. 2. In FIG. 7, a heater wire and radiation foil have been omitted, which permits the keeper electrode 92 to have the smaller inner diameter compared to the keeper electrode 72 of FIG. 7. In these and other embodiments, the inner diameter of the keeper electrode 92 may exceed the outer diameter of the cathode tube 82 by less than 1 mm, which may not be possible in embodiments that include a heater wire and/or radiation foil.

As further illustrated in FIG. 7, the keeper electrode 92 of FIG. 7 includes a neutral confinement conical keeper orifice plate 92A (hereinafter "neutral confinement plate 92A") at its downstream end. Alternatively, the neutral confinement plate 92A may have a shape other than conical, such as cylindrical, or some other shape. The neutral confinement plate 92A may confine neutral gas particles that flow out through the cathode tube 82 and keeper electrode 92 orifices along with the electrons that pass through these regions to an anode structure located in regions beyond the keeper electrode 92. The extended conical feature of the neutral confinement plate 92A may serve to enhance neutral particle density in this region and enhance the plasma production rate here, which may serve to enhance the ability of the cathode tube 82 to emit electrons to an anode structure located in regions beyond the keeper electrode 92. Additional details regarding some example keeper electrodes with neutral confinement features are described in the '733 patent, which is incorporated herein by reference.

Still referring to FIG. 7, in some embodiments, the neutral confinement plate 92A may deter downstream gas, which may be present outside of the hollow cathode device 81, from backstreaming into the cathode tube 82. In particular, the extended conical shape of the neutral confinement plate 92A may deter oxygen and/or other harmful gasses from traveling through the keeper orifice region into the cathode tube 82 from downstream of the hollow cathode device 81.

Additional details regarding some example keeper electrodes with neutral confinement features are described in the '733 patent, which is incorporated herein by reference.

FIG. 8 is a cross-sectional view of three example cathode tubes 100, 104, 106 which may be implemented in, for instance, the hollow cathode devices 61, 81 of FIGS. 6 and 7, arranged in accordance with at least one embodiment described herein. More generally, the cathode tubes 100, 104, 106 may be implemented as the cathode tube in virtually any hollow cathode device together with a low work function insert as described herein.

The cathode tube 100 is illustrated in FIG. 8 as a tube 101 with an end plate 102 having an orifice with a smaller diameter than the end plate. The end plate 102 may be welded to or otherwise secured to or integrally formed in the tube 101 to form the cathode tube 100. The tube 101 may include tantalum and the end plate 102 may include either tantalum or tungsten. Other materials may be used for either or both of the tube 101 or the end plate 102, such as molybdenum, molybdenum-rhenium, and titanium.

The cathode tube 104 may include a tantalum tube 103 with its 105 end formed into a rounded shape, for example using metal spinning, thereby forming an orifice of a desired size. An advantage of tantalum may be that it is sufficiently malleable such that the tube 103 can be formed to have a small sized orifice at its end 105.

The cathode tube 106 may include a tantalum tube 107 with its end 109 formed into an elongated length of desired cross section. Other metals such as molybdenum, molybdenum-rhenium, and titanium can be used in place of the tantalum tube 107 for forming the rounded or elongated cathode tube 106 in any suitable manner (e.g., directly, machining, or other formation process) although it may be more difficult to form these relatively more brittle materials into the rounded or elongated cathode tube shape compared to tantalum. An advantage of the elongated shape of the end 109 of the cathode tube 106 may be that it deters downstream gas—that can be present outside of the hollow cathode device—from backstreaming into the cathode tube 106. In particular, the elongated shape at the end 109 of the cathode tube 106 may deter oxygen or other harmful gasses from traveling into the cathode tube 106 from downstream of the hollow cathode device. Numerous other formed variations of the downstream end of cathode tubes implemented according to some embodiments described herein can be envisioned that give an orifice of a particular size and/or shape.

Another advantage that may arise from a shaped cathode tube may be that it can be shaped such that when a corresponding low work function insert is placed within the cathode tube, the geometry of the cathode tube and insert may fix the location of the low work function insert at a particular distance from the downstream end of the cathode tube. As mentioned previously, if one or more wires are embedded into the low work function insert during its formation process, the one or more wires can be used to fix the low work function insert location as a result of welding or otherwise securing the wires to the cathode tube. The low work function insert can be alternatively located by press-fitting it into the cathode tube, or by crimping the cathode tube at one or more locations upstream, along the length of, or downstream of the low work function insert after the low work function insert is installed.

FIGS. 9A and 9B include cross-sectional views of a low work function insert 110 co-fired with an open-ended crucible cup 114 and a cathode tube 112, arranged in accordance with at least one embodiment described herein. In this and other embodiments, a mixture of ceramic constituents and one or more refractory metals as described herein may first be loaded into the open-ended crucible cup 114, which may be inserted with the mixture into the cathode tube 112 in a vertical orientation such that the mixture is retained within the cup 114 via gravity. A location of the cup 114 within the cathode tube 112 may then fixed, for instance by press-fitting it into the cathode tube 112, or by crimping the cathode tube 112 at one or more locations, upstream, along the length of, or downstream of the cup 114. The resulting assembly, including the mixture, the cup 114, and the cathode tube 112, finally undergoes the aforementioned heating process to solidify the mixture into the porous low work function insert 110. The cup 114 may have one or more open pathways 116 along its length that allow gas to flow within the cathode tube from upstream of the cup 114 to the region near the open-end of the cup 114 and finally through an cathode tube orifice 115. Any number or shape of pathways 116 may be used so long as they allow gas to flow through the cathode tube 112 and past the cup 114.

The example of FIG. 9A may simplify the assembly/manufacturing process for a hollow cathode device by eliminating a step of removing the low work function insert 110 from the cup 114. In other embodiments such as illustrated in FIGS. 6 and 7, low work function inserts may be in direct contact with the corresponding cathode tube, which may be made of metal. In comparison, some low work function inserts made of lanthanum hexaboride ($LaB_6$) cannot be placed directly against the cathode or other metal or such low work function inserts may be contaminated, requiring such low work function inserts to be encased in graphite or other material.

Embodiments of the low work function inserts described herein may be used in traveling wave tubes, electron beam evaporating apparatuses, or other electron sources. For instance, 3D metal printers with powder or wire fed printing media may include tantalum filaments or tungsten-based filaments. Although filaments are commonly envisioned as thin circular wire, some filaments may be generally planar and in some cases may have a generally disc shape with leads. Alternatively or additionally, such generally planar filaments may be stamped or otherwise formed into complex shapes. Low work function inserts as described herein may be coupled directly to or near such filaments or other electron emitters to lower their work function. An example of such a filament with a low work function insert is illustrated in FIGS. 10A-10C.

Embodiments described herein may provide means to improve existing electron-beam filaments, which for example can be used for 3-D wire feed printing applications by reducing their work function, which in turn may reduce their operating temperature and increase their operational lifetime. However, an electron-beam emitting filament may be used in various equipment for different applications that use electron beams. At least one embodiment features a low-work-function insert integrated into a filament that has been modified to include a single hole or a pattern of holes on its top surface, also referred to as its emitting surface or button surface or similar term. More generally, the low work function insert may be implemented as a low work function object, whether considered an insert or not. The insert combined with the filament may be referred to hereinafter as a filament assembly or a low work function filament or similar term. Reference herein to a filament should indicate the presence of the button and low work function object combination. As the filament assembly is heated, the insert may coat the filament top surface through surface diffusion and adsorption/desorption processes with a substance that may reduce the work function of the filament. The rate of diffusion may be controlled by the geometry and distribution of holes introduced to the emitting surface. In an embodiment, the filament may be rejuvenated through a flash cleaning technique.

Figure 10A:
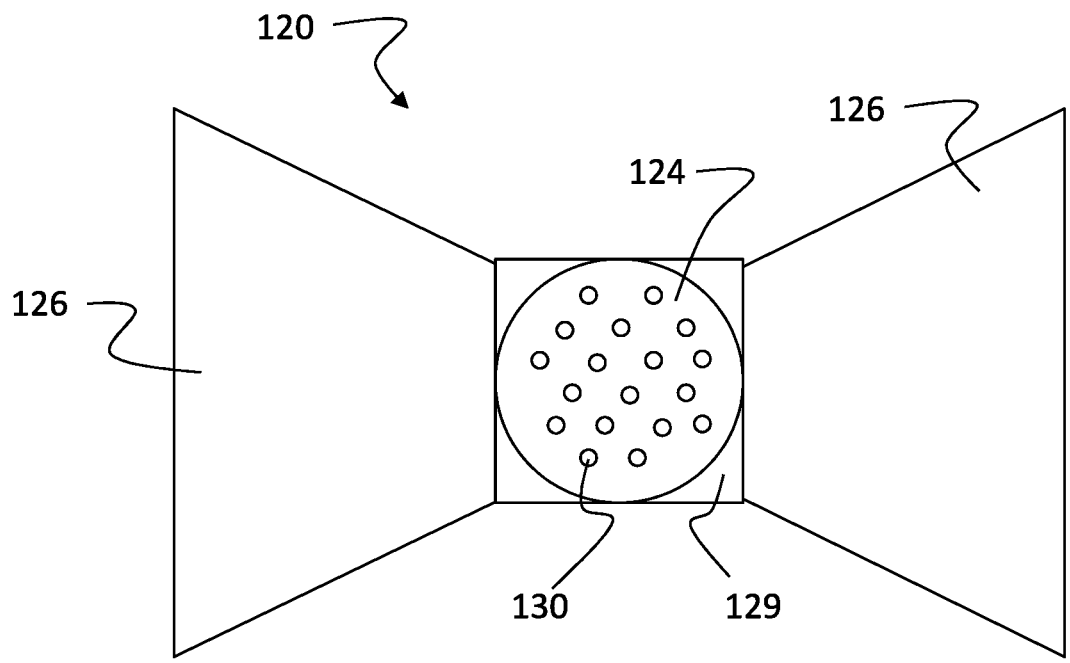
FIG. 10A includes an overhead view of an electron source implemented as a filament.
Figure 10B:
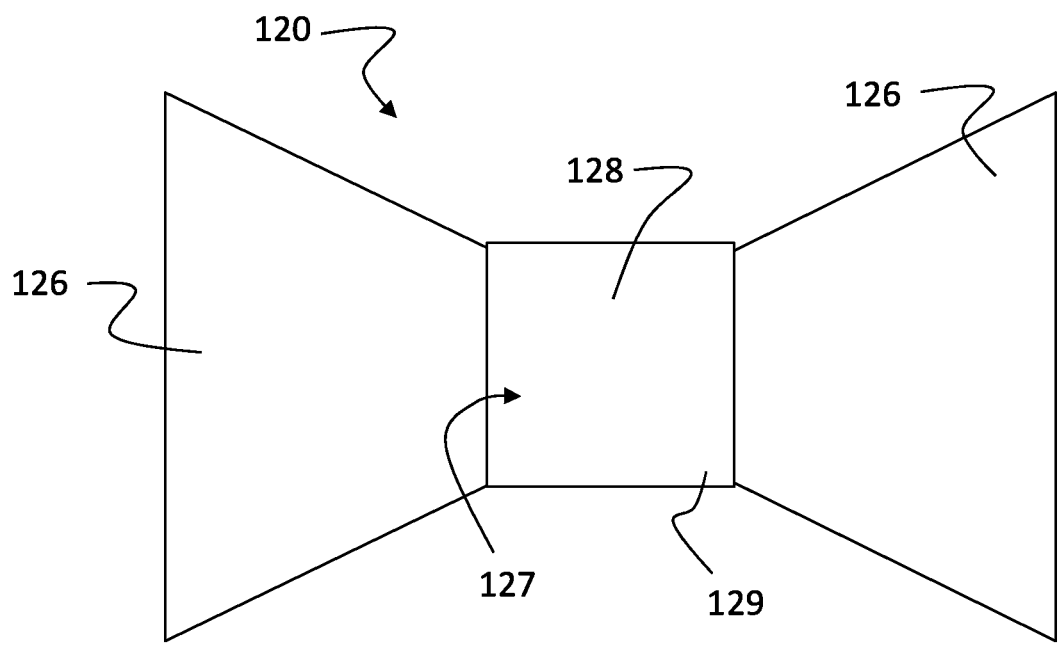
FIG. 10B includes a bottom view of an electron source implemented as a filament.
Figure 10C:
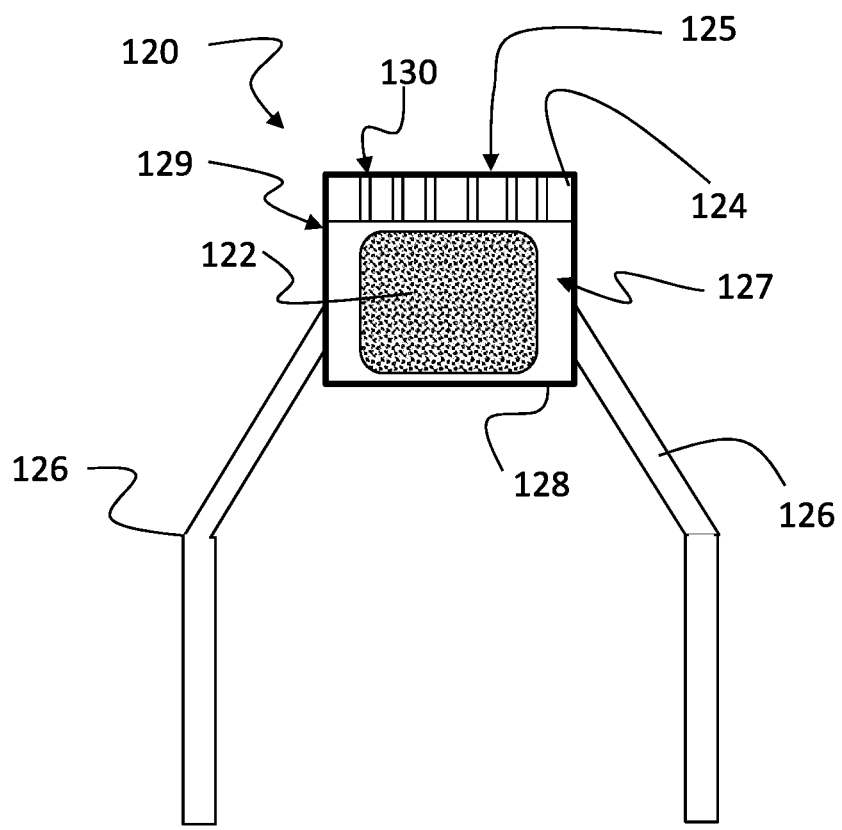
FIG. 10C includes a cross-sectional elevation view of an electron source implemented as a filament.

In more detail, FIGS. 10A-10C include both an overhead view (FIG. 10A), a bottom view (FIG. 10B), and a cross-sectional elevation view (FIG. 10C) of an electron source implemented as a filament 120, arranged in accordance with at least one embodiment described herein. The filament 120 may be included in an electron source, such as a 3D metal printer or other electron source together with a low work function insert 122 that may be similar or identical to other low work function inserts described herein. As illustrated, the filament 120 includes a generally planar disc or button 124 that forms a housing 129 with leads 126 extending therefrom. The leads 126 may be integrated with the housing 129 or coupled therewith, such as by welding, brazing, or the like. The leads 126 may or may not include the bends as illustrated.

The low work function insert 122 may be retained beneath the button 124 by a retainer element 128, which together the button 124 and retainer element 128 form a housing 129 with a chamber 127 therein. The chamber 127 includes the insert 122 therein. The retainer element 128 may include tantalum foil. One or more holes 130 (e.g., apertures) may be formed in the button 124 so as to form a conduit from outside into the chamber 127 in order to permit barium from the low work function insert 122 to migrate, e.g., via surface diffusion processes, through the one or more holes 130 to an exterior surface 125 (e.g., top exterior surface or electron emission/emitting surface) of the button 124. The presence of the barium from the low work function insert 122 may reduce the work function of the filament 120. While the insert 122 formed as a disk is shown in the chamber 127 with spaces around the insert 122, the insert 122 may fill the chamber 127 entirely, or have spaces around the sides and/or top with respect to internal walls of the chamber 127.

During manufacturing, the button 124 may be coupled with the retainer element 128 by any means, such as by the button 124 and retainer element 128 have cooperative threading and being screwed together, welded, brazed, or otherwise formed so as to have the insert 122 within the chamber 127. As such, the button 124 can define the top of the housing 129 and the retainer element 128 may form the sides and bottom of the housing 129. While the housing 129 is shown to have a horizontal cross-sectional profile that is square, the housing 129 can be a cylinder with a circular horizontal cross-sectional profile as shown in FIGS. 11A-11B.

Figure 10D:
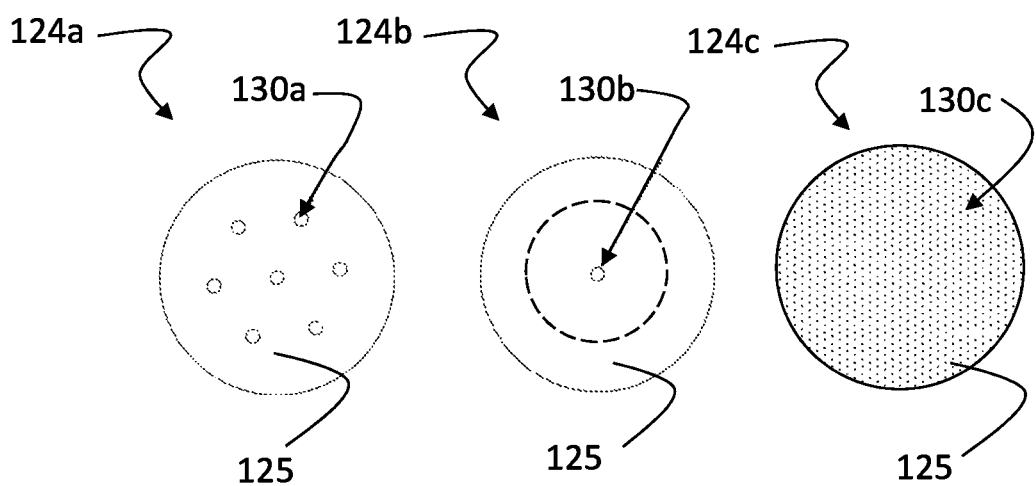
FIG. 10D includes an overhead view of schematic representations of different embodiments of electron emission surfaces of a button of a filament.

The button 124 may also have various configurations. As shown in FIGS. 10A and 10C, the button 124 may have holes 130 extending therethrough so as to form perforations or apertures that extend across the button 124 so as to fluidly couple the outside with the internal chamber 127. FIG. 10D shows some variations in the configuration of the holes 130 in the buttons. For example, the button 124 may include a medium amount (e.g., 15 holes to 30 holes) of holes 130 having a medium cross-sectional profile (e.g., 0.05-0.1 mm diameter), as shown in FIGS. 10A and 10C. The button 124$a$ may include a small amount (e.g., 2 holes to 14 holes) of holes 130$a$ having a small cross-sectional profile (e.g., 0.1-0.5 mm diameter), as shown in FIG. 10D. The button 124$b$ may include a single hole 130$b$ having a medium or large cross-sectional profile (e.g., large cross-sectional profile shown with dashed circle: 0.5 mm-3 mm diameter), as shown in FIG. 10D. The button 124$c$ may include a large amount (e.g., 31 holes to 100 holes or more) of holes 130$c$ having an extremely small cross-sectional profile (e.g., 0.001-0.05 mm diameter), as shown in FIG. 10D. While the holes 130 are circular, the holes may have any shape. The holes 130 may have uniform or equal distributions (e.g., equal spacing or distance from each other), a uniform pattern, or other uniform arrangement; however, the holes 130 may be randomly arranged or in unequal distributions (e.g., unequal spacing or distance from each other), a non-uniform pattern or other non-uniform arrangement. In some examples, a button 124$a$, 124$b$ with a fewer number of larger holes can be used in a hollow cathode. In some examples, a button 124, 124$c$ with a large number of smaller holes can be used in an electron gun (e.g., additive manufacturing). The holes 130 can be formed by any means, from drill bit drilling, to laser drilling, electron beam machining, electro-chemical energy, or any other process.

Figure 11A:
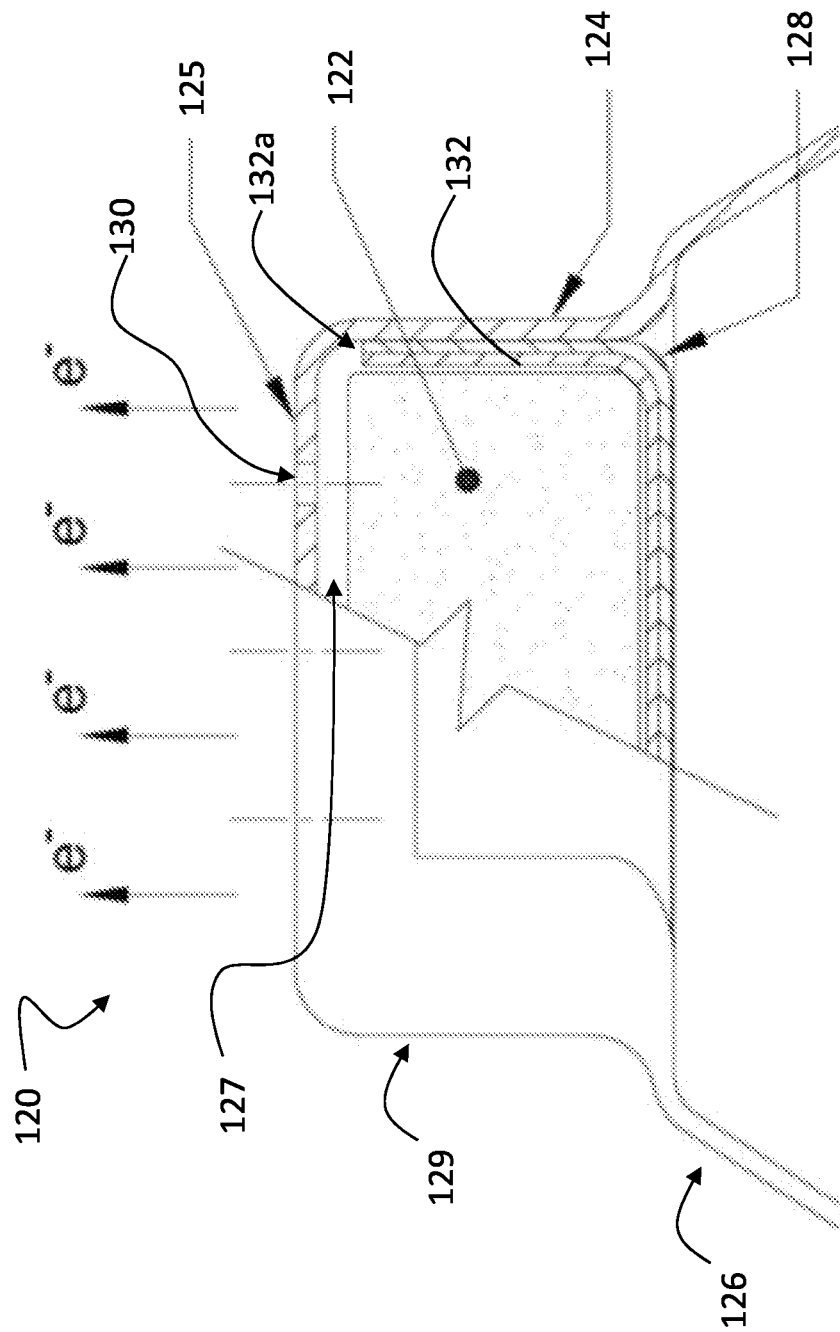
FIG. 11A includes a hybrid side elevation view and cross-sectional side elevation view of a filament, FIG. 11B includes an overhead view of an embodiment of a filament, FIG. 11C includes a side view of an elongated cylindrical basket showing the button and insert therein.

As shown in FIG. 11A, the filament 120 (e.g., filament assembly) can include a housing 129 formed from a button 124 having an emission surface 126 (e.g., top external surface) with holes therein 130 and sides that extend down and either attach to the leads 126 or form into the leads 126. A retainer element 128 is attached to the button 124 so that the sides of the retainer element 128 are within the body of the button 124, which sides wrap around to form the bottom of the retainer element 128. The basket 132 is inside the internal chamber 127 formed from the button 124 and retainer element 128. The basket 132 containing the insert 122 is within the retainer element 128 such that the basket 132 is attached to the retainer element 128 as shown. However, the retainer element 128 can be omitted and the basket 132 can be used to retain the insert 122 behind the button 124. Also, the retainer element 128 can be one layer of tantalum and the basket 132 can be another layer of the tantalum. In some aspects, the retainer element 128 can be configured similar to the button 124 and the insert 122 may or may not be wrapped around the bottom and sides with a tantalum foil (e.g., basket 132).

In some embodiments, the retainer element 128 and/or the basket 132 can be sealed with the button 124 to form an air-tight seal. This results in the holes 130 being the only exit for the barium from the insert 122.

FIG. 11B shows a top view of the filament 120 when the button 124 and housing 129 are cylindrical. That is, the housing 129 is not square or other shape, and thereby the housing 129 conforms to a circular shape of the button 124. As shown, the leads 126 are mounted to the cylindrical housing 129.

FIG. 11C shows an example of an elongated cylindrical basket 232, which can be used in a filament 120 as described herein. The basket 232 can include a cylindrical side wall 234 and a base 236 with an open top 238 to allow electrons to be emitted through. While a gap 240 is shown between the insert 122 and the button 124, the insert 122 and button 124 may be in contact with each other, or an insulating member (e.g., porous ceramic) may be positioned therebetween. The height of the insert 122 and location of the button 124 within the basket 232 may be varied, such as being at the bottom with a short insert 122.

FIG. 11D shows a tall insert 122 with the button 124 at the top of the basket 232 such that the holes 130 (shown as the dots) form the openings from the basket 232 to allow for the barium to escape to cover the emission surface. Accordingly, the shape of the housing 129 can be modulated to accommodate inserts 122 and baskets 232 of various cylindrical heights.

Figure 11E:
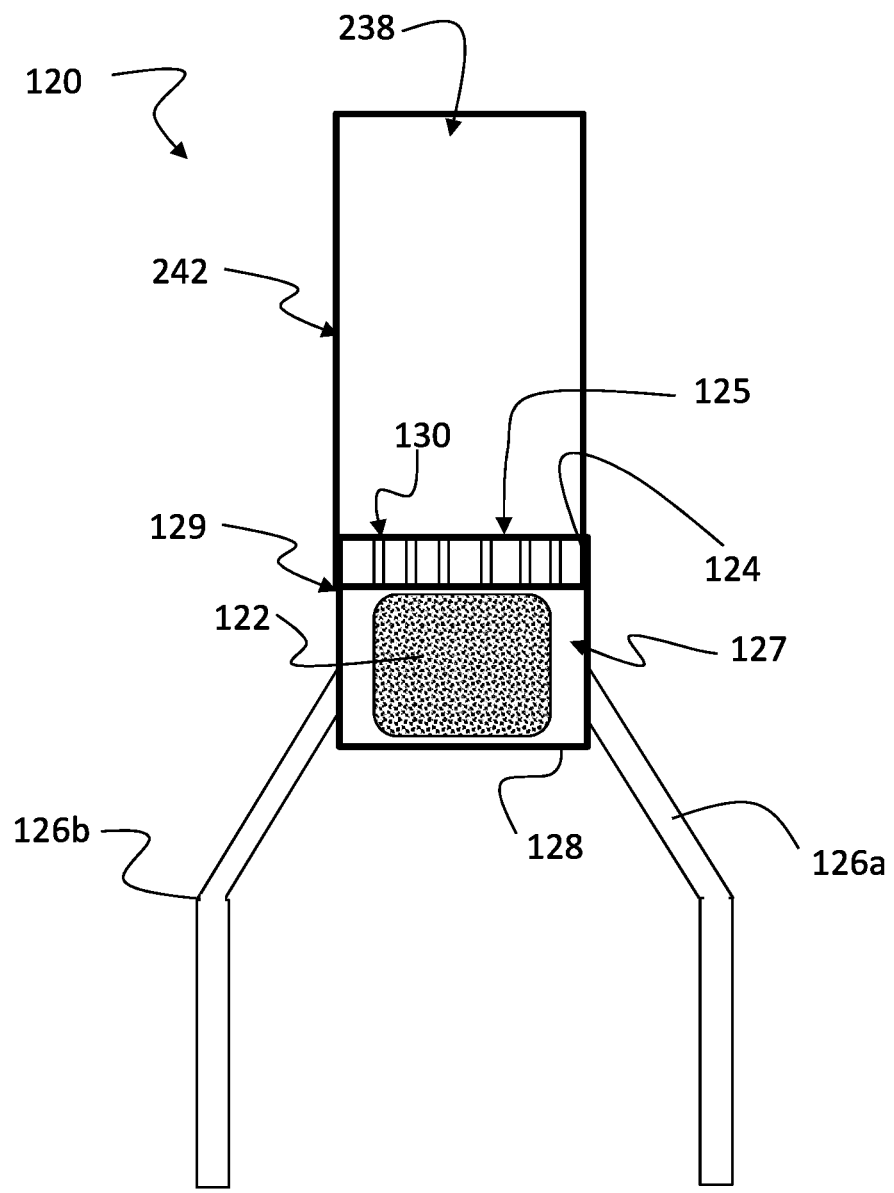
FIG. 11E includes a cross-sectional elevation view of a filament having an extended cylinder.

FIG. 11E shows another embodiment where a cylinder extension 242 is mounted to the perimeter of the button 124 or to the housing 129, or as an extension of the basket (e.g., 132 or 232). The cylinder extension 242 can be a foil, such as tantalum and may be made from the same material as the basket 132 or 232 so as to be an extension therefrom. Accordingly, the cylinder extension 242 may have the features of the basket 132 or 232 described herein. The use of such a cylinder extension 242 can increase the usable current, such as for example, from 1.5 A up to 3 A, and possibly higher without erosion of the filament. In some aspects, the cylinder extension 242 can turn the filament into a hollow cathode-type assembly. As shown, one lead is a current inlet lead 126a and the other lead is a currently outlet lead 126b, which denotes the flow of current through the filament 120.

Figure 11F:
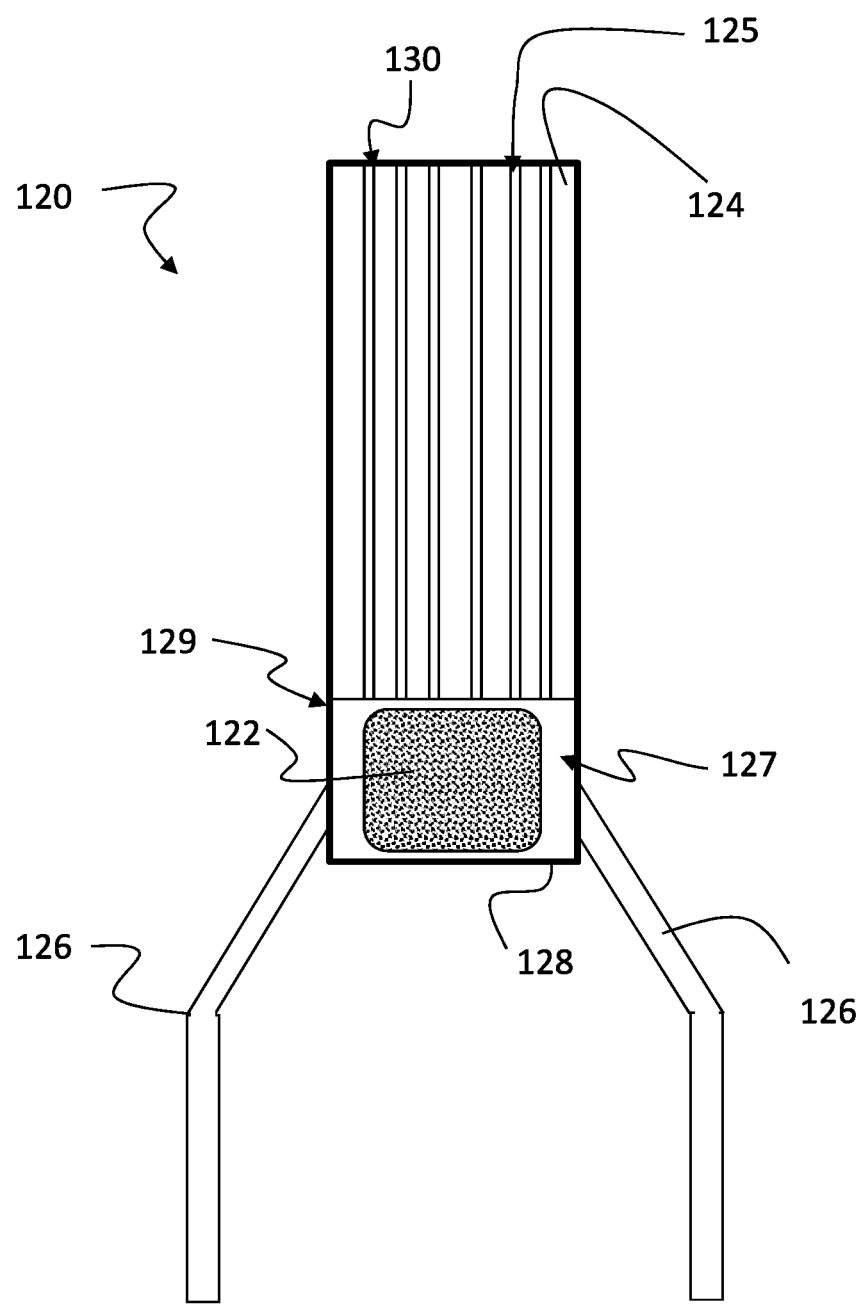
FIG. 11F includes a cross-sectional elevation view of a filament having an elongated button.

FIG. 11F shows another embodiment where the height of the button 124 is increased along with the dimension of the holes 130 from the emission surface 125 to the internal chamber 127 of the housing 129.

Figure 12A:
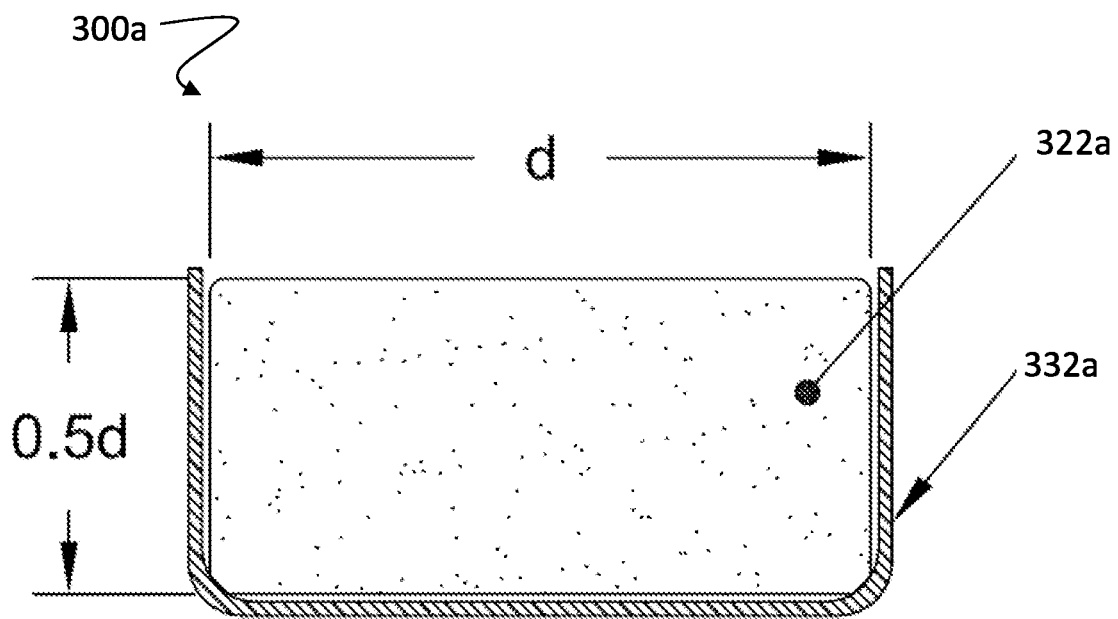
FIG. 12A includes a cross-sectional elevation view of a disk low work function object in a carrier.

FIG. 12A shows an example of an insert package 300a that includes a low work function insert 322a in a basket 332a. As shown, the insert 322a and basket 332a have a width dimension "d" and a height that is "0.5d" (e.g., half of the width dimension "d"). As such, the height is about half of the width. These width and height dimensions are examples and may vary. However, when configured for use in an electron gun, the limited space availability may be satisfied by the width dimension "d" and the height that is "0.5d".

Figure 12B:
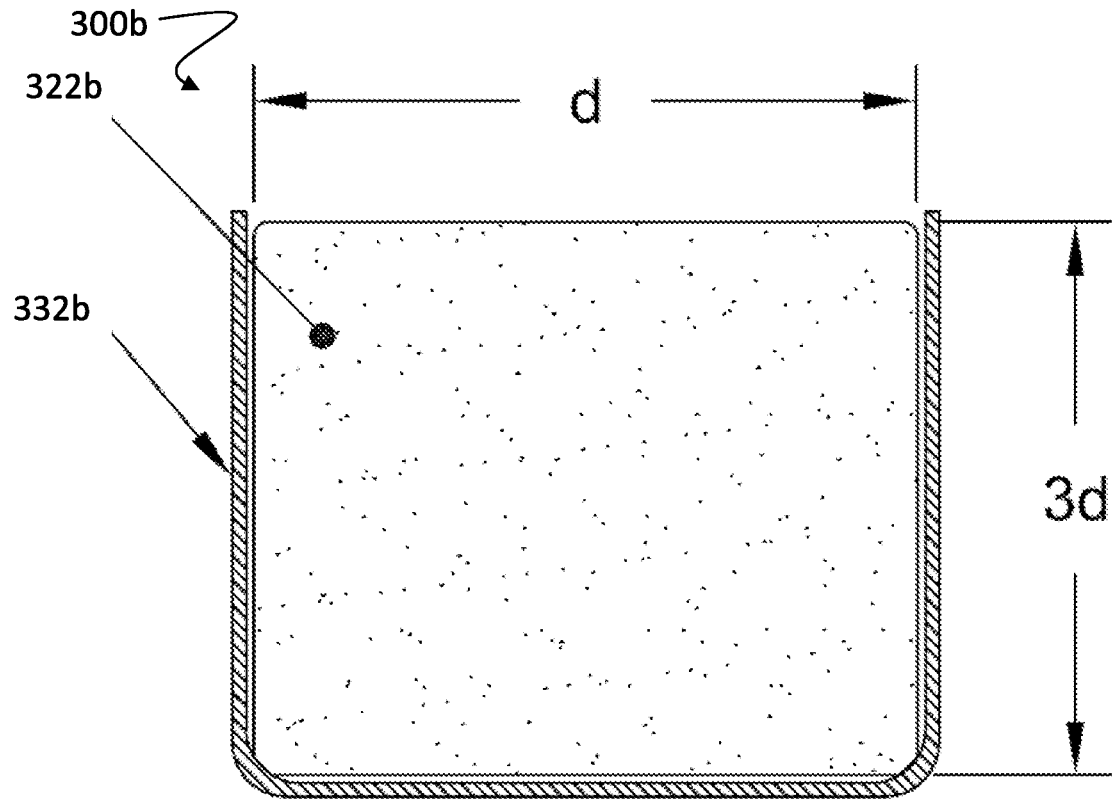
FIG. 12B includes a cross-sectional elevation view of a cylinder low work function object in a carrier.

FIG. 12B shows an example of an insert package 300b that includes a low work function insert 322b in a basket 332b. As shown, the insert 322b and basket 332b have a width dimension "d" and a height that is "3d" (e.g., 3 times the width dimension "d"). As such, the height is about three times the width. These width and height dimensions are examples and may vary. However, when configured for use in a plasma bridge neutralizer (PBN), the availability of space may allow the width dimension "d" and the height that is "xd", where the "xd" may be 2, 3, 4, 5, 6, 7, 8, 9, or 10 times the size of dimension "d" or any value there between.

In some examples, FIGS. 12A-12B are schematic cross-sections of cylindrically-shaped, tungsten-ceramic materials 322a, 322b of two sizes enclosed in a basket 332a, 332b made from 0.0005" thick tantalum foil. The size of the low work function material shown in FIG. 12A is typical for vacuum electron source applications. The size of the low work function material shown in FIG. 1B is configured for plasma electron source applications, such as the Plasma Bridge Neutralizer (PBN).

Figure 13A:
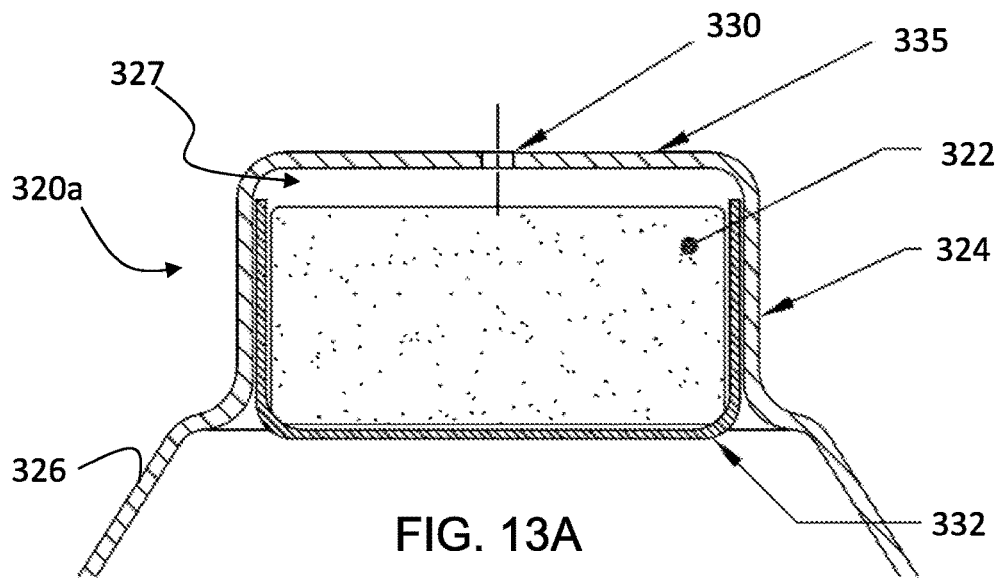
FIG. 13A includes a cross-sectional elevation view of an electron source implemented as a filament with a single small hole in an election emission surface.
Figure 13B:
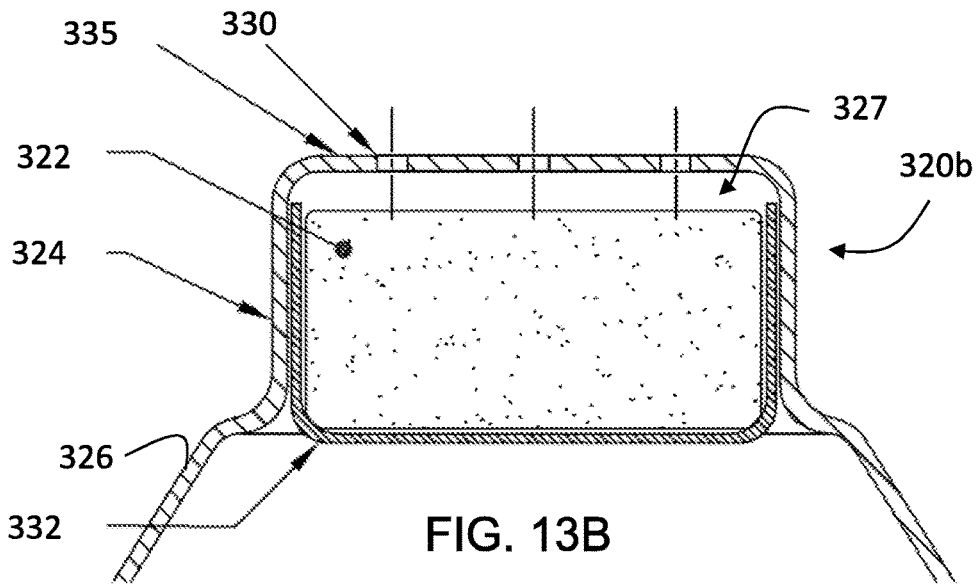
FIG. 13B includes a cross-sectional elevation view of an electron source implemented as a filament with a plurality of small holes in an electron emission surface.

FIG. 13A shows an example of a filament 320a including a low work function insert 322 in a basket 332. As shown, the basket 332 is attached to the button 324 so as to form the internal chamber 327 therebetween such that the insert 322 is in the internal chamber 327. As shown, the button 324 includes the electron emission surface 335 and a circular side wall extending down therefrom to the legs 326. The basket 332 forms an interface with the button 324, which can be sealed by welding, brazing, or the like. The electron emission surface 335 can include a single hole 330 (see FIG. 10D, button 124b with small hole (solid circle)). FIG. 13B shows an embodiment of a filament 320b that includes a plurality of holes 330, such as for example in a seven hole pattern (see FIG. 10D, button 124a).

In some examples, FIGS. 13A-13B are schematic cross-sections of two low work function filament variants. Diffusion orifices (e.g., holes 330) can vary in size, quantity, and location. The vapor released from the decomposition of the ceramic constituent of the low work function insert 322 flows to and diffuses over the emitting surface 335.

Figure 13C:
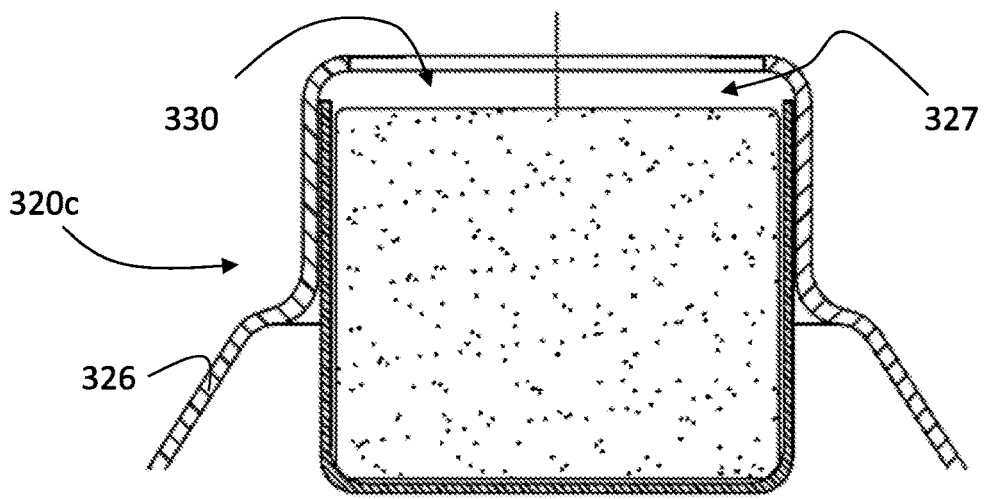
FIG. 13C includes a cross-sectional elevation view of an electron source implemented as a filament with a single large hole in an election emission surface.

FIG. 13C shows an embodiment of a filament 320c that includes a single large hole 330 (see FIG. 10D, button 124b with large hole (dashed line circle)), but otherwise configured as shown in FIG. 13A and having the relative dimension of FIG. 12B.

FIG. 14A shows a partial cross-sectional side view of an embodiment of a filament 420 that includes a low work function insert 422 in a basket 432 that is coupled to a button 424, which can be configured similarly as shown in FIG. 13C having a single large hole 430. The button 424 can include a cylindrical extension 442 attached thereto, such as by welding, brazing or other coupling. As shown, the cylindrical extension 442 extends from a top surface of the button 424 adjacent to the single large hole 430, so that the cylindrical extension 442 is between the hole 430 and the side walls of the button 424. The cylindrical extension 442 includes an open top 438 that can be aligned with the single large hole 430 in the button 424. However, the cylindrical extension 442 can be used with buttons having a plurality of holes. FIG. 14B shows a partial overhead view of the filament 420 showing the open top 438 and the single large hole 430 so as to see the low work function insert 422.

FIG. 15A shows a partial cross-sectional side view of an embodiment of a filament 420 that includes a low work function insert 422 in a basket 432 that is coupled to a button 424, which can be configured similarly as shown in FIG. 14A having a single large hole 430 along with the cylindrical extension 442 with the open top 438. Here, the cylindrical extension 442 is mounted to the button 424 as shown in FIG. 14A.

Additionally, the cylindrical extension 442 can include one or more side apertures 450. The side apertures 450 can allow for the evolved barium to diffuse or otherwise exit from within the cylindrical chamber 441 of the cylindrical extension 442 in order to coat an outer surface of the cylindrical extension 442. FIG. 15B shows a partial overhead view of the filament 420 showing the open top 438 and the single large hole 430 so as to see the low work function insert 422. FIG. 15B also shows the arrangement of the side apertures 450 in the side of the cylindrical extension 442.

FIG. 16A shows a partial cross-sectional side view of an embodiment of a filament 420 that includes a low work function insert 422 in a basket 432 that is coupled to a button 424, which can be configured similarly as shown in FIG. 14A having a single large hole 430 along with the cylindrical extension 442 with the open top 438. However, the cylindrical extension 442 is mounted to the side walls of the button 424. The mounting of the cylindrical extension 442 to the side walls can be by welding, brazing, or the like. FIG. 16B shows a partial overhead view of the filament 420 showing the open top 438 and the single large hole 430 so as to see the low work function insert 422.

FIG. 17A shows a partial cross-sectional side view of an embodiment of a filament 420 that includes a low work function insert 422 in a basket 432 that is coupled to a button 424, which can be configured similarly as shown in FIG. 16A having a single large hole 430 along with the cylindrical extension 442 with the open top 438. Here, the cylindrical extension 442 is mounted to the side walls of the button 424 as shown in FIG. 16A. Additionally, the cylindrical extension 442 can include one or more side apertures 450. The side apertures 450 can allow for the evolved barium to diffuse or otherwise exit from within the cylindrical chamber 441 of the cylindrical extension 442 in order to coat an outer surface of the cylindrical extension 442. FIG. 17B shows a partial overhead view of the filament 420 showing the open top 438 and the single large hole 430 so as to see the low work function insert 422. FIG. 17B also shows the arrangement of the side apertures 450 in the side of the cylindrical extension 442.

The low work function objects (e.g., inserts) can be used in long lifetime electron emitters. For example, the low work function objects can be used as drop-in replacements for filaments used in metal additive manufacturing and electron beam welding or used in newly manufactured filaments. The low work function objects can also be configured for use in other applications as well.

Figure 20:
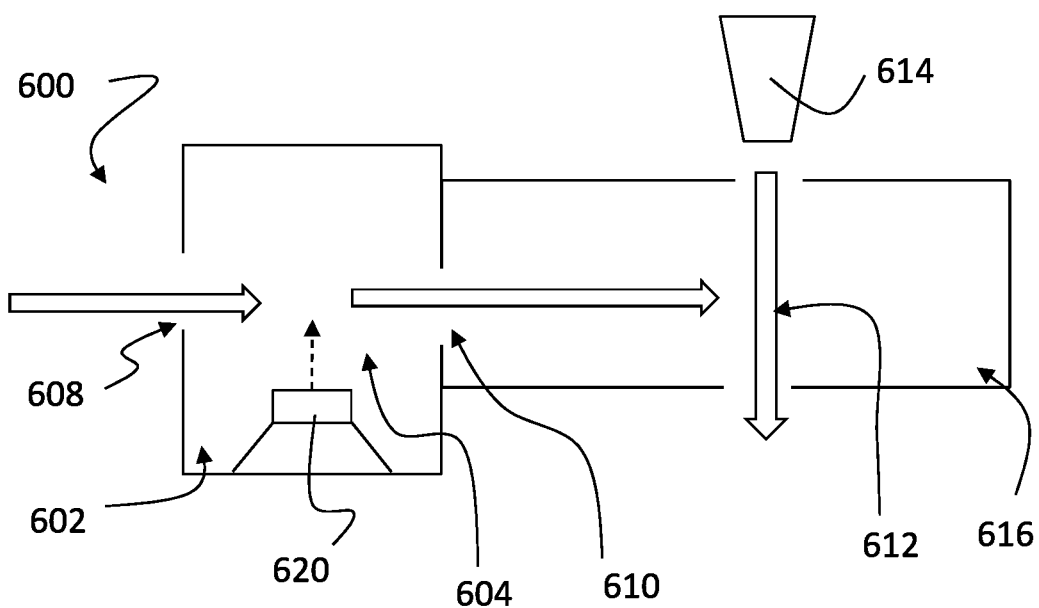
FIG. 20 includes a schematic representation of a plasma bridge neutralizer, all arranged in accordance with at least one embodiment described herein.

In some embodiments, technologies that use thin-film deposition or ion beam etching for their products and services neutralize the ions used in their manufacturing processes with electrons thermionically emitted from tungsten or tantalum filaments, and thereby the low work function object as well as the filaments described herein can be used with these technologies. These filaments 620 are typically housed within a small discharge chamber 602, and can be referred to as a plasma bridge neutralizer (PBN) 600 as shown in FIG. 20. The electrons sourced from the filaments 620 are allowed to collide with an inert gas 604 that is fed into the discharge chamber 602 via an inlet 608 (e.g., arrow in) to increase the electron density by producing secondary electrons as well as positively-charged gas ions. Both primary and secondary electrons are then extracted (e.g., arrow out) from the chamber 602 of the PBN 600 via an outlet 610 to neutralize ions 612 produced by a separate ion source 614 as well as prevent a charge build-up on components within the process chamber 616.

Filaments used in these charge-neutralizing applications share the same lifetime limitations as the electron emitters used in additive manufacturing and electron beam welding, which can use the filaments and low work function objects described herein. The filaments in PBNs can evaporate over time as electrons are emitted from their surfaces. For filaments made from tungsten or tantalum, which can be used in the button, basket, or housing of a filament, evaporation rates can be high due to the operating temperatures (e.g., between 2200° C. and 2400° C.) required to thermionically emit electrons. With the addition of a low work function insert (e.g., made from a tungsten-ceramic material or other material described herein that evolves barium at high temperatures), the lifetime of PBN filaments can be increased significantly by sourcing and thermionically emitting electrons from the insert and nearby filament extended surfaces and housing of the filament and any external electron emitting surface at moderate operating temperatures between 1000° C. and 1200° C. once surface diffusion processes have sufficiently covered these surface with a low work function substances. In addition, when sufficiently dense plasma has been created, it can be used to continue heating the insert, in what is referred to as a self-heating mechanism, allowing the DC electrical current that was used to heat the filament to initiate thermionic emission to be reduced or turned off entirely. Self-heating to continue thermionic electron emission from the low work function object can be a mechanism used with hollow cathodes, such as those described herein.

In some embodiments, the applicability of the filaments and low work function objects (e.g., described herein for electron guns or additive manufacturing) can be applied to PBN filaments with minor changes to the geometries and dimensions. As such, the disclosure herein can be modified for use as PBN filaments.

The low work function object can be made in a variety of sizes and shapes. Typically, for the uses described herein the low work function object can be formed as a right cylinder or circular disk. However, other shapes are possible. Two general sizes of the low work function insert are shown in FIGS. 12A and 12B, respectively, and described herein. With the exception of a single face (e.g., top surface), both sizes of the low work function object can be entirely enclosed in tantalum foil, which acts to support and secure the low work function object to the filament. The open top of the tantalum foil can allow for vapor (e.g., barium vapor) created by the decomposition of the ceramic material to diffuse from the exposed cylinder face of the low work function object. The tantalum foil is referred to as a basket herein because it carries the low work function object.

The insert package 300a of FIG. 12A can be used in applications for additive manufacturing and electron beam welding. As shown, the height of the low work function object (e.g., insert 322a) can be limited to approximately half its diameter "d" to accommodate the spatial restrictions of the electron gun assembly. No such spatial restrictions exist with common PBN configurations providing greater flexibility in the height of the insert which can be elongated to approximately three times the diameter (e.g., "3d") of the insert 322b as shown in FIG. 12B.

FIGS. 13A-13B show two example variations of the filament (e.g., 320a, 320b) used with additive manufacturing and electron beam welding. With the application of the low work function insert to PBN filaments, greater electron current densities and current are desirable, thereby the diffusion orifices (e.g., holes 330) to control the dispensing of vapor molecules (e.g., barium vapor) may be omitted. Instead the filaments can be modified for low work function PBN filaments as shown in FIG. 13C.

FIGS. 13A-C, 14A-14B, 15A-15B, 16A-16B, and 17A-17B show five general embodiments and configurations for low work function PBN filaments with elongated low work function inserts. These embodiments are capable of greater electron current densities, which are desirable for PBN filaments, so the diffusion orifices (e.g., holes) have been configured as single, large holes (see FIG. 10D, button 124b with large hole (dashed line circle)) exposing the entire open face of the low work function insert. FIGS. 13A-C show a configuration with the exposed face of the low work function insert allowing for thermionic electron emission from the surface of the insert. Also, electron emission can occur off of other nearby surfaces once they are adequately coated with a low work function substance and their temperature is raised to a moderate level of 1000 to 1200° C. The PBN filament can be further modified to enhance emission current densities by taking advantage of the same adsorption and surface diffusion processes described herein for other inserts. By adding a cylindrical extension, which provides an extended surface from the emission hole in the filament, vapor (e.g., barium vapor) released by the low work function insert can adsorb onto these extensions for the benefits described herein. Also, the cylindrical extension can thermionically emit electrons as well, which can be improved by the coating of barium as described herein. These cylindrical extensions can be made from tantalum, and can be attached to the filament on the edge of the large, centrally-located hole on the top of the button as shown in FIGS. 14A-14B and 15A-15B. Alternatively, the cylindrical extensions can be attached to the outer walls of the filament as shown in FIGS. 16A-16B and 17A-17B. The cylindrical extensions are shown as open-faced, right cylinders, but similar extension surfaces can be fashioned into cones or other geometries and coupled with the filament as described herein. FIGS. 15A-15B and 17A-17B show these cylindrical extensions (e.g., extended surfaces) with a pattern of diffusion orifices formed into the walls of the surfaces. This allows adsorbed vapor molecules to surface diffuse to the exterior wall of the extended surface where thermionic electron emission can also occur.

In some embodiments, electron emitters with low work function inserts such as the filament 120 with the low work function insert 122 may experience little or no degradation in thermionic electron emission performance after repeated exposure to air in non-vacuum conditions. As used herein, non-vacuum conditions may mean that attempts are not actively made to evacuate air. In these and other embodiments, such electron emitters with low work function inserts may generally be operated in a vacuum and may be cooled to 150° C. or below before being exposed to air and then returned to vacuum for subsequent operation. In comparison, some electron emitters with ceramic impregnated porous tungsten inserts may experience significant degradation in thermionic electron emission performance with each exposure to air.

Barium generated during operation from low work function inserts formed according to some embodiments described herein may coat other nearby surfaces that may typically be made of tantalum, molybdenum, tungsten, moly-rhenium, and/or other refractory materials or alloys. The barium often finds an oxygen atom on these nearby surfaces and forms a dipole that can reduce the work function of these nearby surfaces. Hence electron emission might occur off the nearby surfaces, and it is possible that more or all of the electron emission might occur off these nearby surfaces. In this manner, some embodiments of the low work function inserts described herein may serve as a reservoir of barium. Thus, such low work function inserts might be considered both a dispenser and/or a reservoir, and the low work function inserts described herein may be implemented as either or both.

The tungsten or other metals used to form low work function inserts as described herein may include 325 mesh (particles of about 40-45 micrometers in size), 2500 mesh (particles of about 4 micrometers in size), or any other mesh powdered tungsten and/or other metals.

When mixing the ceramic constituents (e.g., as oxides and/or oxide precursor compounds) and/or refractory metal(s), one or more mixing techniques may be applied, such as ball milling, sonication in water or alcohol, addition of polyvinyl binder(s), addition of lubricant(s), mortar and pestle, and/or other techniques.

The present low work function filament design can be provided in various configurations. In each of the configurations, the insert can be mounted on the exterior or interior of the housing of the filament with various modifications made to the emitting planar surface. However, the insert 122 can preferably be included within the chamber 127 of the housing 129.

One step of manufacturing a low work function filament according to at least one embodiment described herein may involve forming small holes in the button 124 as shown in the figures. The insert 122 may be machined into a disk using a lathe. Each machined disk of the insert 122 may in an example embodiment be about 0.05" thick and 0.160" in diameter +/−1%, 2%, 5%, 10%, 20%, 25%, 40%, 50%, 75%, or 100%.

As shown in FIG. 11A, a piece of thin Ta foil 132 (0.0005" thick in an example embodiment) may be formed around the insert 122 in the shape of a cup or basket using a die. The formed piece of Ta foil 132 may be referred to hereinafter as a basket (e.g., basket 132). The insert 122 and basket 132 may then be attached to a filament 120 using a spot welder, such that a basket lip 132*a* of the basket 132 forms a relatively tight interface to an internal perimeter of the housing 129 of the filament 120 to form the filament assembly that includes the basket 132 and the disk insert 122 attached to the back of the filament button 124 with the retainer element 128 so as to form the housing 129. In addition to serving as a basket 132 to hold the disk insert 122, the Ta foil may also serve as a radiation shield that reduces an amount of heat that would radiate from the disk insert 122 if the shield were not there. After attaching the basket 132 to the back side of the button 124 with the insert 122 made of tungsten-ceramic material inside, the surface of the insert 122 can be seen through the holes 130 in the button 124. In one example, the basket 132 can be formed from at least one layer of tantalum foil, such as two layers of 0.0005 inch thick tantalum foil. The button can be formed from 0.005" thick tantalum with an emitter surface that is 0.175" in diameter and including an array of holes to allow the dispensing of barium.

In some aspects, the height of the insert 122 may vary. For example, the height of the insert 122 may range from about 0.800" to about 0.820", about 0.360" to about 0.380" or about 0.050" to about 0.085" where a height of about 0.050" is an example. In some aspects, the diameter of the insert 122 may vary. For example, the diameter of the insert 122 may range from about 0.550" to about 0.570" about 0.240" to about 0.260" or about 0.050" to about 0.070" where a diameter of about 0.165" is an example.

In some aspects, the height of the basket 132 or 232 (or cylinder extension 242) may vary. For example, the height of the basket 132 or 232 (or cylinder extension 242) may range from about 1.425" to about 1.445" about 0.860" to about 0.880" or about 0.050" to about 0.085" where a height of about 0.050" is an example. In some aspects, the diameter of the basket 132 or 232 (or cylinder extension 242) may vary. For example, the diameter of the basket 132 or 232 (or cylinder extension 242) may range from about 0.551" to about 0.571" about 0.166" to about 0.176" or about 0.060" to about 0.080" where a diameter of about 0.166" is an example.

In some aspects, the height of the button 124 may vary. For example, the height of the button 124 may range from about 0.0825" to about 0.0830" about 0.385" to about 0.390" or about 0.090" to about 0.095" where a height of about 0.090" is an example. In some aspects, the diameter of the button 124 may vary. For example, the diameter of the button 124 may range from about 0.555" to about 0.575" about 0.170" to about 0.175" or about 0.130" to about 0.135" where a diameter of about 0.173" is an example.

In some embodiments, the height of the insert 122, button 124, basket 132 232, or cylinder extension 242 can have a diameter:height ratio, which can range from 1 to 3, 1 to 2, 1 to 1, 2 to 1, or other range. In some aspects, shorter and wider inserts can be used in a filament for additive manufacturing or other electron gun (see FIG. 12). In some aspects, taller and narrower inserts can be used in a filament for a plasma generating device, such as in the cathode assemblies described herein (see FIGS. 6, 7, 8, and 9A-9B). The diameter:height ratio can be tailored to the specific application and/or the desires of the end-user. Diameters can be reduced or enlarged to provide low or high current densities, and heights can be shortened or elongated to affect longevity.

In some embodiments, the insert can be polished. In one example, the insert can be polished with a dry polish using fine grit, alumina sandpaper. Contamination from sandpaper particles may not be of significant concern since alumina ($Al_2O_3$) is a constituent part of the ceramic. In another example, the insert can be polished by ion beam polishing with an ion beam (e.g., up to 20 hours at a glancing angle of about 84 degrees). In yet another example, the insert can first undergo a dry polish and then undergo an ion polish. It has been found that by first performing the dry polish, the ion polish can be completed in a significantly shorter time period, which is economically advantageous.

After the filament assembly has been prepared, it may be installed into a test fixture and placed in a vacuum test facility. The pressure within the vacuum test facility may be reduced to roughly $10^{-6}$ Torr, and the filament assembly may be heated to a range of 1000-1200° C. by flowing electrical DC current through the filament assembly. Typically, currents between 30-38 A may be adequate to raise the temperature to this level for a filament assembly such as depicted in FIGS. 10A-10C and 11A-11F. These currents are about 20-30 A lower than the current needed to heat a traditional filament. As the filament assembly is heated to 1000-1200° C., chemical reactions occur within the tungsten ceramic material of the insert, and it begins to produce barium vapor that builds within the basket enclosure. The basket enclosure and the tight interface it creates with the filament may minimize the amount of barium vapor that escapes from a back side of the filament. At steady-state, the barium vapor created within the basket may continuously condense onto and re-evaporate from a downward or rearward facing button filament surface disposed above and facing the tungsten-ceramic disk, and a steady-state surface coverage fraction of barium may be nearly 100% over the entire interior surface including regions near the entrance to the holes in the top surface. After the inside surface is coated with barium, the barium may migrate via surface diffusion processes through the small holes in the button and may begin to coat the emission surface as a portion of the exterior surface (or whole exterior surface) of the filament with barium atoms. On the exterior of the filament, the barium atoms may expand outward and may cover a portion of the button emission surface, where an extent of coverage of the barium atoms may be determined by the distance from a hole channel where the barium atoms are being sourced. More or less barium coverage may be provided by the number, size, and location of the holes (e.g., FIG. 10D).

The work function of a traditional Ta filament surface (~4.2 electron volts (eV)) may be reduced by the presence of the barium atoms when the barium atoms sit on top of most of the oxygen atoms that are nearly always present on bare Ta surfaces. A barium-oxygen dipole that forms over the tantalum surface can result in a work function as low as 2 eV. While the process of barium production, migration, and surface diffusion continues, the filament can maintain this reduced work function at relatively low heater current for a long operational time. Although barium is being sourced from the tungsten-ceramic material, which could be considered a source of contamination in some applications, only very little barium is generated. Typically less than 1 mg may be released over tens of hours of operation and a vast majority of this mass will condense on surfaces within the apparatus holding the filament rather than be released to a workpiece downstream.

Figure 18:
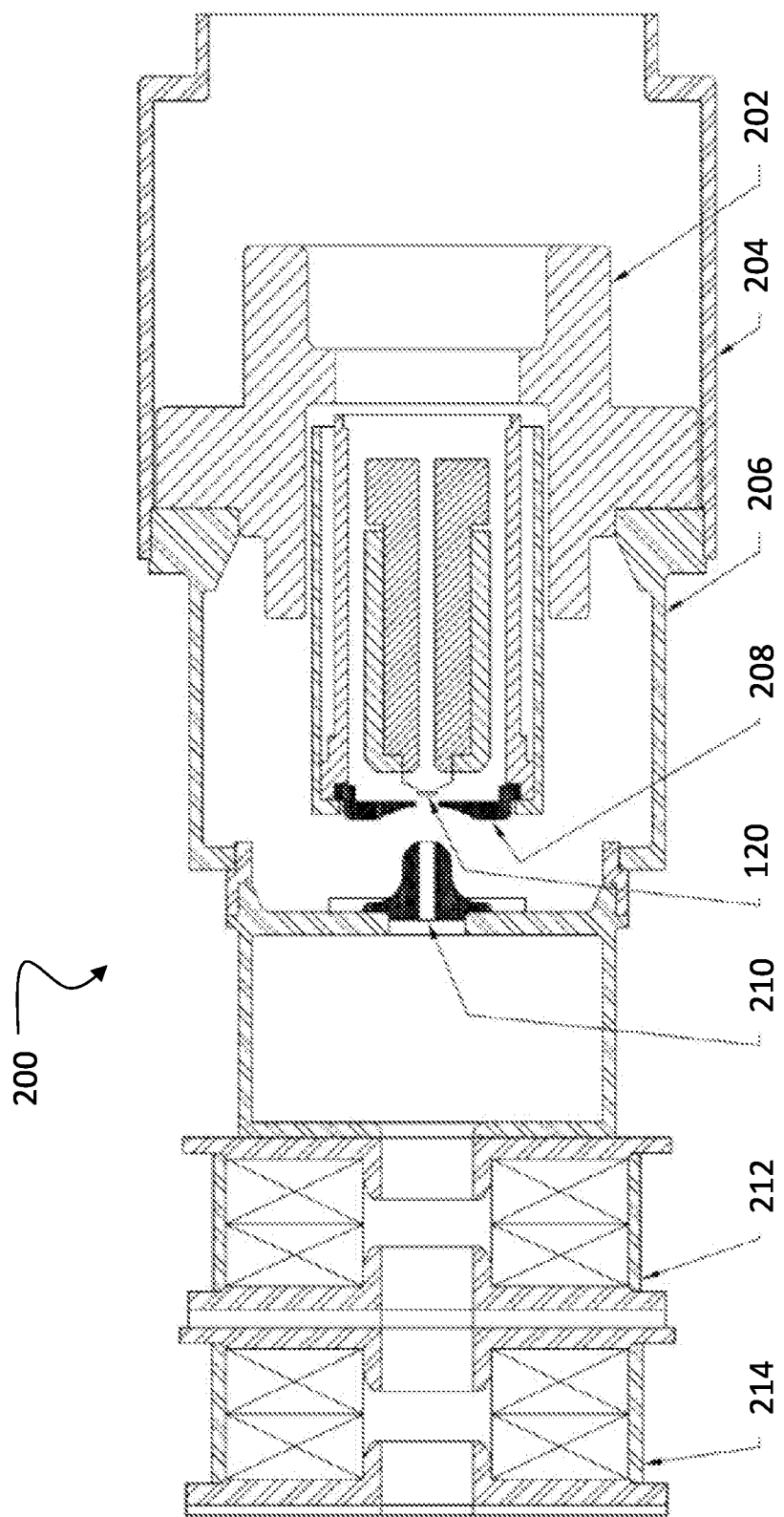
FIG. 18 includes a cross-sectional schematic diagram of an electron beam gun.

FIG. 18 shows an embodiment of an electron gun 200 that can include a filament 120 as described herein. The electron gun 200 can include a gun cup 202, shield 204, gun body 206, cathode 208, the filament 120 (or other embodiment), anode 210, focus coil 212, and deflection coil 214 arranged as illustrated and generally known in the art. That is, any existing electron gun 200 can have its filament replaced by the filament 120 described herein, or any new electron gun 200 may be manufactured with the filament 120.

Figure 19:
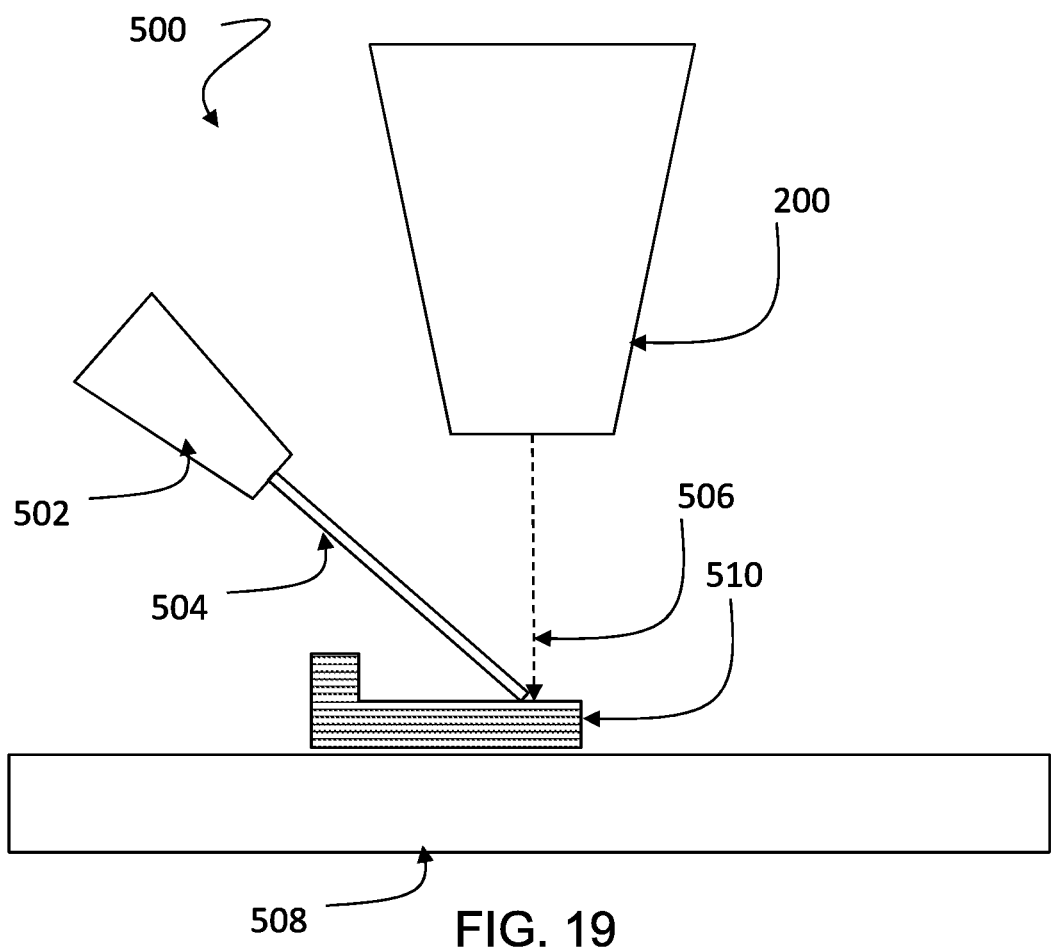
FIG. 19 includes a schematic representation of an additive manufacturing system.

FIG. 19 provides a schematic representation of an additive manufacturing system 500 that can use the filament 120 (or other embodiment) as described herein. The additive manufacturing system 500 can include the electron gun 200 of FIG. 18, which includes the filament 120. The additive manufacturing system 500 can include a wire feeder 502 (or powder feeder) that provides the wire 504 (or powder) to the electron beam 506 emitted from the electron gun 200. The intersection of the wire 504 and electron beam 506 causes the wire 504 (or powder) to melt and/or become molten. The additive manufacturing system 500 can include a substrate 508 for holding an article 510 that is formed by additive manufacturing, such as layer by layer manufacturing. The substrate 508 may be movable relative to the electron gun 200 and wire feeder 502 so that complex shapes may be formed by additive manufacturing. While not shown, a preheater (e.g., laser, resistive element, or other) may be thermally coupled with the filament 120 within the electron gun 200 so as to retain the filament 120 at an operational temperature. This can allow for the filament 120 to be used for continuous, on-demand, or interval additive manufacturing protocols.

The integration of the tungsten-ceramic material as an insert (122) can extend the operational use compared to traditional filaments. Traditional filaments in some 3D printing applications have productive lifetimes ranging from 4-12 hours. The addition of the tungsten-ceramic material insert may allow the filament assembly, according to at least some embodiments described herein, to properly operate without exceeding a heating current of 38 A—a reduction of 34-44% compared to traditional filaments. A manually controlled test that maintained a targeted emission current of 200 mA over the course of 75 hours was performed, which showed a significant increase in lifetime. A lower operating temperature associated with the heating current increased the lifetime of the filament 120.

Printing campaigns in additive manufacturing operations can range from long duration runs that allow filaments to remain within a vacuum environment to short duration runs that expose filaments to air multiple times throughout its life. Cathodes that utilize traditional low work function materials are known to rapidly degrade in performance following exposure to air, so emissions from the filament assembly may be evaluated in conditions similar to those seen in live operations. Following several exposures to air for various durations of time, the most recent configurations of filament assemblies according to at least some embodiments described herein demonstrated consistent and satisfactory performance for additive manufacturing applications.

Each time a tungsten-ceramic disk (e.g., insert 122) of a filament assembly is exposed to air, contaminants such as oxygen, carbon dioxide, and water may be absorbed into a tungsten matrix of the tungsten-ceramic disk. Conditioning the insert safely may remove these contaminants that would otherwise cause irreversible chemical reactions resulting in a shortened lifespan of the filament assembly if allowed to operate while still present. However, conditioning sequences for typical hollow cathodes with low work function inserts may take up to hundreds of minutes; therefore it may be necessary to determine a conditioning sequence that ensures acceptable and consistent emissions that do not inhibit productivity. Tests employing various conditioning schemes have resulted in a sequence that reduces the span of time from hundreds of minutes down to 4-15 minutes without compromising the performance of the filament assembly.

The configuration of the filament assembly also allows for the heating of the filament's emitting surface to high temperatures somewhat independently of the tungsten-ceramic insert enclosed within. By quickly increasing and then decreasing the heater current, or flashing, to approximately 60 A, a spike in temperature may be experienced by only the filament, but not the insert. In situations where reduced emissions from a filament have been observed, flashing may have the effect of removing contaminant buildup in the form of adsorbed atoms and molecules, particles, and flakes from the emitting surface that would impede emissions. The rapid change in the filament's temperature may minimize the radiative heat transferred from the filament to the tungsten-ceramic insert thereby preserving the barium contained within the insert. The observed result of flashing filament assemblies has been the recovery of emissions lost from contaminant deposition on the emitting surface as well as the extended viability of the filament in general. Thus, an electron gun having a filament 120 with the insert 122 may be operated as described to improve operation parameters and longevity of the filament. In one aspect, the mode of operation can include flash heating the filament to a high temperature (e.g., 2400 degrees kelvin) without heating the insert to that temperature, and then dropping the temperature of the filament to normal operation temperatures. This can cause contaminates, such as oxygen or barium oxide or barium dioxide, to flash to vapor and be removed prior to operation and election emission and prior to evolving the barium. For example, this elevated temperature can be achieved for about 1000 milliseconds before returning to a normal operating temperature. The flash spiked temperature treatment can be useful after the filament is exposed to air or other source of oxygen. The short time at high temperatures results in very little evaporation of the filament and very little grain growth, and consequently, does not shorten the filament lifetime.

Some embodiments of the filament assembly described herein include the beneficial combination and application of a tungsten-ceramic low work function insert manufactured through a simplified process and a mechanism to control the diffusion of the low work function material to filaments used in 3-D printing applications. The combination also allows for rejuvenation of the filament (e.g., flash heating button, housing etc. without heating insert), which is not possible in similar art such as dispenser and reservoir cathodes. These integrated features result in the filament assembly that may significantly extend the usage of otherwise short lifetime filaments while preserving manufacturing simplicity.

Some embodiments of the filament described herein include the tungsten-ceramic insert within a housing having the holes in the emission surface of the button that are discretely located and sized to control the supply of barium to the exterior surface of the filament from the remotely located source tungsten-ceramic insert. In hollow cathodes, the insert is heated causing chemical reactions in the insert, which produce barium. The barium evaporates from the tungsten-ceramic insert colliding with an inert gas that is also flowed through the hollow cathode. With the help of the gas flow, the barium produced within a hollow cathode migrates from the insert surface to the inside of the hollow cathode tube in the regions near the insert. The barium coats these surfaces and reduces the work function in these regions. The free electrons released from these surfaces are accelerated into a dense plasma that they create and sustain within the hollow cathode. Finally, electrons are extracted from the dense plasma through an orifice plate that is formed at the downstream end of the hollow cathode. The extracted electrons are used to drive plasma loads downstream of the hollow cathode for a variety of applications.

In some embodiments of the filament assembly described herein, the tungsten-ceramic insert is fashioned into a disk, and is completely enclosed within a housing as mentioned above. The filament and insert are heated, similar to the hollow cathode, in order to create barium vapor; however, unlike the application to a hollow cathode, diffusion of the barium vapor does not involve a gas and no plasma is formed. The diffusion of barium, and subsequently, the design of some embodiments described herein, rely on the reduction of work function due to surface diffusion and adsorption/desorption of barium.

The filament assembly may also separate the emitting surface from the barium generation surface. This configuration may be easier to achieve compared to reservoir-style emitters that use a porous tungsten emitting surface placed in front of a reservoir containing barium, aluminum, and calcium oxides. Some embodiments may also allow for a flash cleaning technique of contaminants from the emitting surface and rejuvenation of the filament assembly. This may involve the ability to transiently heat the emitting surface to high temperatures in a manner that is somewhat independent of the temperature of the remotely located barium generating material. Some embodiments may also vary the amount of barium producing material to extend life as needed.

In some embodiments, the low work function insert material described herein may be replaced in the filaments, cathodes, and electron guns as well as other equipment, assemblies and devices with a different type of low work function material. The low work function material used herein may be any type that can evolve barium (e.g., barium vapor) during operation, including, but not limited to, compositions used in reservoir and dispenser type cathodes such as 5:3:2, 4:1:1, and 3:1:1. In some instances, a traditional low work function material that evolves barium can be used in the filaments, cathodes, and electron guns.

The low work function objects can be used in long lifetime electron emitters, which can be used as drop-in replacements for filaments used in metal additive manufacturing and electron beam welding. This innovation, however, can also be configured for use in other applications as well. Industries that rely on thin-film deposition or ion beam etching for their products and services neutralize the ions used in their manufacturing processes with electrons thermionically emitted from tungsten or tantalum filaments. These filaments are typically housed within a small discharge chamber and are collectively referred to as a plasma bridge neutralizer (PBN). The electrons sourced from the filaments are allowed to collide with an inert gas that is fed into the discharge chamber to increase the electron density by producing secondary electrons as well as positively-charged gas ions. The collection of ions, electrons, and neutral particles is referred to as a plasma. Both primary and secondary electrons are then extracted from the PBN to neutralize ions produced by a separate ion source as well as prevent a charge build-up on components within the process chamber.

In some embodiments, the filament can be conditioned prior to operational use. The filaments can be checked to make sure there is a proper gap distance between the filament and anode, such as about 0.575 inches or other desirable value (e.g., 0.020-0.060" for a gun assembly). Testing for emission current can be done using ramp waveforms to maximum applied voltages of 500 V, 1000 V, and 3000 V or any other voltage consistent with a given application.

With each exposure to air, contaminants, such as water vapor, carbon dioxide, and oxygen, can infiltrate the insert and adsorb in and on the insert material. If traditional barium-tungsten inserts are heated too quickly, the contaminants can cause irreversible chemical reactions to occur, poisoning the insert, and negatively affecting the cathode's performance. Poisoning can also occur if an insert is exposed to air before it is allowed to sufficiently cooldown. This would subsequently require operating the filament at a higher temperature to maintain the minimum emission current resulting in accelerated barium evaporation, rapid ceramic decomposition, and reduced usable lifetime. It is possible that the insert material is more robust than traditional inserts. Consequently possible insert poisoning can be avoided through a shorter duration conditioning process that safely removes these contaminants. This can be done once the filament is at hard vacuum and involves stepwise heating the filament and insert to allow the outgassing of contaminants. Conditioning can take from minutes to hours depending on the cathode, the type of contaminant, the amount of exposure, the temperature during exposure, and the reactivation temperature. Table A lists the conditioning sequences used, which specifies the heater current and the duration at which the filament was held, which resulted in adequate electron emission currents (200 mA) for additive manufacturing and electron beam welding applications.

TABLE A

Low work function filament conditioning sequence.

| Heater Current (A) | Sequence #1 (min) | Sequence #2 (min) |
| --- | --- | --- |
| 10 | 3 | 5 |
| 20 | 3 | 5 |
| 30 | 3 | 5 |
| 40 | 3 | 5 |

When tested, a heating current of a specified amperage was applied to the low work function filament. Adequate time was allowed to elapse to reach steady state before a brightness temperature measurement of the test article was made using a disappearing filament pyrometer. The pulse bias waveform was then applied to the filament, which was also used to acquire the gross system current collected by the anode. This general procedure was used with heating currents between 30-40 A (with incremental changes of 1 A) to produce electron emission data over a range of operating temperatures.

In one embodiment, a low work function filament assembly can include a filament with a housing having a planar button region and a plurality of legs coupled to the housing. The planar button region defines a one or more holes that pass through the planar button region from an upper surface to a lower surface of the planar button region so as to fluidly couple outside of the filament and an internal chamber within the housing. A low work function object (e.g., insert) is positioned behind the planar button region within the housing. A basket can be located within the internal chamber of the housing, such that the basket can retain the low work function object in the internal chamber so as to be positioned behind the planar button region. In some aspects, the filament can include tantalum. In some aspects, the basket includes tantalum foil. In some aspects, the tantalum foil has a thickness of about 0.0005 inches. In some aspects, the low work function object can be formed as a disk of tungsten-ceramic material. The low work function object can include a low work function insert as described herein. In some aspects, the low work function filament assembly is configured to maintain a targeted emission current of a desired value for at least 50 hours. In some aspects, the low work function filament assembly is configured to maintain a targeted emission current of a desired value for at least 70 hours. In some aspects, the low work function object includes barium and a size of each of the one or more holes and a distribution of the one or more holes determines an extent of coverage of barium on the upper surface of the planar button region due to at least surface diffusion. In some aspects, the low work function filament assembly demonstrates consistent and satisfactory performance for additive manufacturing applications after each of multiple exposures to air in non-vacuum conditions. In some aspects, the planar button region of the filament and the low work function object are sufficiently thermally independent to flash clean contaminants from an electron emission surface of the planar button region by transiently heating the planar button region in a manner that is at last partially independent of the low work function object such that during the flash clean the planar button region reaches a first temperature that is significantly higher than a simultaneously reached second temperature of the low work function object. In some aspects, the low work function object is positioned facing the lower surface of the planar button region and the basket retains the low work function object facing the lower surface of the planar button region. In some aspects, during operation of the filament the low work function object is configured to emit a low work function vapor that comes in contact with the planar button region.

Some embodiments described herein generally relate to a simplified formation process of a low work function insert. Some embodiments described herein additionally relate to low work function inserts prepared according to the simplified formation process and/or to electron sources such as hollow cathode tubes or other electron beam sources that include such low work function inserts.

In some embodiments, a method to form a low work function insert includes preparing a mixture that includes a first powder that contains barium, a second powder that contains calcium, a third powder that contains at least one of aluminum, samarium, or magnesium, and a fourth powder that contains a refractory metal. The method may also include heating the mixture, contained in a crucible, in a furnace. Oxygen concentration in the furnace may be maintained at a low partial pressure during heating of the mixture in the furnace. In some aspects, the refractory metal of the fourth powder includes at least one of tungsten, molybdenum, tantalum, iridium, osmium, or titanium. In some aspects, the third powder contains aluminum and the fourth powder contains tungsten. In some aspects, preparing the mixture includes combining together the first powder, the second powder, and the third powder according to an atomic ratio of barium atoms to calcium atoms to pairs of aluminum atoms of 5:3:2, 4:1:1, 6:1:2 or 3:1:1. In some aspects, preparing the mixture includes combining together the first powder, the second powder, the third powder, the fourth powder, and a fifth powder that contains scandium oxide. In some aspects, the fourth powder makes up 50% to 95% by weight of an aggregate weight of the mixture. In some aspects, the fourth powder makes up 75% to 95% by weight of the aggregate weight of the mixture. In some aspects, preparing the mixture includes combining together the first powder, the second powder, the third powder, the fourth powder, and a powder added to the fourth powder that contains at least one additive metal that is different than the refractory metal of the fourth powder, each of the at least one additive metal selected from the group consisting of tungsten, nickel, iridium, osmium, titanium, molybdenum, or tantalum. In some aspects, heating the mixture in the furnace comprises heating the mixture in a vacuum furnace, the method further comprising evacuating the vacuum furnace to a pressure of less than $1 \times 10^{-3}$ Torr and maintaining the pressure at less than $1 \times 10^{-3}$ Torr during the heating. In some aspects, heating the mixture in the furnace includes: increasing a temperature within the furnace at a first rate from an initial temperature to a peak temperature; maintaining the temperature within the furnace at the peak temperature during a peak temperature hold time; and decreasing the temperature within the furnace at a second rate from the peak temperature to a final temperature.

In some aspects, increasing the temperature within the furnace at the first rate from the initial temperature comprises increasing the temperature within the furnace at the first rate in a range from 15-35° C. per minute from room temperature; maintaining the temperature within the furnace at the peak temperature during the peak temperature hold time comprises maintaining the temperature within the furnace at the peak temperature within a range from 1400-1750° C. during the peak temperature hold time within a range from 5-60 minutes; and decreasing the temperature within the furnace at the second rate to the final temperature comprises decreasing the temperature within the furnace at the second rate in a range from 10-35° C. per minute to room temperature. In some aspects, increasing the temperature within the furnace at the first rate from the initial temperature to the peak temperature comprises continuously increasing the temperature from the initial temperature to the peak temperature without dwelling at any intermediate temperatures between the initial temperature and the peak temperature. In some aspects, heating the mixture in the furnace comprises heating the mixture in an air furnace.

In some embodiments, prior to the heating, the method further includes placing the crucible that contains the mixture in a ceramic container with a gas-permeable seal and placing the ceramic container that contains the crucible that contains the mixture in the air furnace. In some aspects, preparing the mixture that includes the first powder that contains barium oxide, the second powder that contains calcium oxide, the third powder that contains at least one of aluminum oxide, samarium oxide, or magnesium oxide, and the fourth powder that contains the refractory metal is performed with or without at least one of: preparing an initial mixture that includes the first powder, the second powder, and the third powder without the fourth powder and preheating the initial mixture; or heating the mixture in a hydrogen atmosphere. In some aspects, the heating of the mixture converts the mixture from a powder compound to a porous compound and the method further includes removing the porous compound from the crucible; and machining the porous compound to a machined shape, the low work function insert including the porous compound with the machined shape.

In some embodiments, a low work function insert may include a porous compound that includes a refractory metal uniformly distributed with a ceramic that includes multiple different phases. In aggregate, the ceramic includes barium oxide, calcium oxide, and another oxide. Each phase of the ceramic may include at least one of the barium oxide, the calcium oxide, or the other oxide. The other oxide may include at least one of aluminum oxide, samarium oxide, or magnesium oxide. The refractory metal may make up at least 50% of the low work function insert by weight. In some aspects, a porous compound comprising a refractory metal uniformly distributed with a ceramic that includes in aggregate barium oxide, calcium oxide, and another oxide, which can be at least one of aluminum oxide, samarium oxide, or magnesium oxide. In some aspects, the other oxide includes aluminum oxide; the refractory metal includes tungsten; and the refractory metal makes up 75-95% of the low work function insert by weight. In some aspects, the low work function insert further includes at least one of: scandium oxide; or an additive metal that includes at least one of nickel, iridium, osmium, titanium, molybdenum, or tantalum.

In some embodiments, an electron source may include an electron emitter and a low work function insert coupled to the electron emitter. The low work function insert may include a porous compound that includes a refractory metal uniformly distributed with a ceramic that includes multiple different phases. In aggregate, the ceramic includes barium oxide, calcium oxide, and another oxide. Each phase of the ceramic includes at least one of barium oxide, calcium oxide, or the other oxide. The other oxide may include at least one of aluminum oxide, samarium oxide, or magnesium oxide. The refractory metal may make up at least 50% of the low work function insert by weight. The electron emitter can include any embodiment of a low work function insert. In some aspects, the electron emitter includes a planar filament and the low work function insert is coupled to a surface (e.g., rear surface) of the planar filament. In some aspects, the electron emitter functions as a thermionic emitter after repeated exposure to air in non-vacuum conditions. In some aspects, the electron source includes a plasma electron emission source; the electron emitter includes a cathode tube; and the low work function insert is coupled to an interior surface of the cathode tube.

In some aspects, the electron source further includes a hollow keeper electrode that surrounds the cathode tube and the low work function insert, the hollow keeper electrode having an inner diameter that exceeds an outer diameter of the cathode tube by less than 1 millimeters (mm). In some aspects, the hollow keeper electrode includes a neutral confinement conical keeper orifice plate. In some aspects, the electron source further includes a crucible co-fired with the electron emitter and the low work function insert during assembly of the electron source.

The instant application describes techniques to make barium calcium aluminate (or other) low work function inserts by mixing and heating powders with or without embedded wires in a single step process. Low work function inserts made according to such techniques may be used in hollow cathode devices, traveling wave tubes, electron beam-based 3D metal printers, electron beam evaporating apparatuses, or other electron sources. Such hollow cathode devices may be used to produce electron beams, and support the production of plasma for ion sources, ion thrusters, end-Hall plasma sources, Hall-effect thrusters, and for plasma neutralization to list just a few applications.

The present disclosure is not to be limited in terms of the particular embodiments described herein, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds, compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A filament assembly comprising:
    a button having a planar emitter region with one or more apertures extending from an emission surface of the planar emitter region to an internal surface opposite of the emission surface;
    an inlet electrical lead coupled to the button at a first side;
    an outlet electrical lead coupled to the button at a second side opposite of the first side; and
    a low work function object positioned adjacent to the internal surface of the planar emitter region and retained to the button, wherein:
        the low work function object includes barium and is configured to evolve barium therefrom when heated;
        the low work function material of the low work function object includes a porous ceramic material having the barium;
        the porous ceramic material includes a refractory metal distributed with a ceramic that includes barium oxide, calcium oxide, and an other oxide;
        the other oxide includes at least one of aluminum oxide, samarium oxide, or magnesium oxide; and
        the refractory metal makes up at least 50% of the low work function object by weight.
2. The filament assembly of claim 1, wherein the planar emitter region comprises a plurality of apertures.
3. The filament assembly of claim 1, further comprising a retainer member coupled with the button to form a housing having an internal chamber, wherein the low work function object is retained within the internal chamber.
4. The filament assembly of claim 3, wherein at least one of the button or retainer member includes tantalum.
5. The filament assembly of claim 1, further comprising a basket having the low work function object located in the basket.
6. The filament assembly of claim 5, wherein the basket includes tantalum foil.
7. The filament assembly of claim 1, wherein the low work function object further comprises an additive metal that includes at least one of nickel, iridium, osmium, titanium, molybdenum, or tantalum.
8. An electron gun comprising:
    a cathode;
    the filament assembly of claim 1 adjacent to the cathode with a gap therebetween; and an anode spaced apart from the cathode.
9. An additive manufacturing system comprising:
    the electron gun of claim 8; and
    a wire feeder configured to feed wire into a path of an electron beam emitted from the filament assembly.
10. A plasma bridge neutralizer comprising:
    a chamber having a gas inlet; and
    the filament assembly of claim 1 located in the chamber with the planar emitter region facing gas in the chamber.
11. A method of emitting electrons from a filament assembly, the method comprising:
    providing the filament assembly of claim 1;
    passing current from the inlet electrical lead through the filament assembly to the outlet electrical lead; and
    heating the filament assembly until electrons are emitted from the planar emitter region of the button.
12. A method of manufacturing the filament assembly of claim 1, the method comprising:
    forming the button to have a body with a planar emitter region;
    forming the one or more apertures through the body at the planar emitter region;
    positioning the low work function object adjacent to the internal surface of the planar emitter region; and
    attaching the inlet electrical lead and outlet electrical lead to opposite sides of the button.
13. The method of claim 12, further comprising polishing the low work function object by one of:
    abrasive polishing with a dry abrasive;
    ion beam polishing; or
    abrasive polishing with a dry abrasive followed by ion beam polishing.
14. The filament assembly of claim 1, wherein the one or more apertures are transmissive to electrons.
15. The filament assembly of claim 1, wherein the one or more apertures allow migration of atoms and/or molecules from the low work function object to the emissive surface.
16. The filament assembly of claim 1, wherein the refractory metal includes tungsten.
17. The filament assembly of claim 1, wherein the low work function object has a polished external surface.
18. A filament assembly comprising:
    a button having a planar emitter region with one or more apertures extending from an emission surface of the planar emitter region to an internal surface opposite of the emission surface;
    an inlet electrical lead coupled to the button at a first side;
    an outlet electrical lead coupled to the button at a second side opposite of the first side;

a low work function object positioned adjacent to the internal surface of the planar emitter region and retained to the button; and a cylindrical tantalum foil associated with the button.

19. The filament assembly of claim 18, wherein the cylindrical tantalum foil extends from the button away from the low work function object.

20. A method of emitting electrons from a filament assembly, the method comprising:

provideing a filament assembly comprising:

- a button having a planar emitter region with one or more apertures extending from an emission surface of the planar emitter region to an internal surface opposite of the emission surface;
- an inlet electrical lead coupled to the button at a first side;
- an outlet electrical lead coupled to the button at a second side opposite of the first side; and
- a low work function object positioned adjacent to the internal surface of the planar emitter region and retained to the button;

passing current from the inlet electrical lead through the filament assembly to the outlet electrical lead;

heating the filament assembly until electrons are emitted from the planar emitter region of the button;

decontaminating the button by flash heating the button to a first temperature that vaporizes one or more contaminants such that the low work function object is at a second temperature that is lower than the first temperature so that barium is not evolved therefrom;

cooling the button to an operational temperature; and heating the low work function object to the operational temperature.

* * * * *